(12) United States Patent
Johnson

(10) Patent No.: US 9,052,355 B2
(45) Date of Patent: Jun. 9, 2015

(54) WAFER PROBER INTEGRATED WITH FULL-WAFER CONTACTOR

(75) Inventor: Morgan T. Johnson, Portland, OR (US)

(73) Assignee: TRANSLARITY, INC., Fremont, CA (US)

( * ) Notice: Subject to any disclaimer, the term of this patent is extended or adjusted under 35 U.S.C. 154(b) by 0 days.

(21) Appl. No.: 13/068,158

(22) Filed: Mar. 10, 2011

(65) Prior Publication Data

US 2013/0021052 A1   Jan. 24, 2013

Related U.S. Application Data

(63) Continuation of application No. 12/404,277, filed on Mar. 13, 2009, now abandoned.

(60) Provisional application No. 61/069,457, filed on Mar. 13, 2008.

(51) Int. Cl.
*G01R 31/00* (2006.01)
*G01R 31/28* (2006.01)
*G01R 1/073* (2006.01)

(52) U.S. Cl.
CPC ........ *G01R 31/2887* (2013.01); *G01R 31/2889* (2013.01); *G01R 1/07342* (2013.01)

(58) Field of Classification Search
CPC ........... G01R 1/07378; G01R 31/2889; G01R 1/07342
USPC ................. 324/750.2, 754.18, 757.01, 757.03
See application file for complete search history.

(56) References Cited

U.S. PATENT DOCUMENTS

| | | | |
|---|---|---|---|
| 3,602,634 A | 8/1971 | Meuli | |
| 4,249,034 A | 2/1981 | Fichot et al. | |
| 4,349,831 A | 9/1982 | Theroux | |
| 5,302,852 A | 4/1994 | Kaneda et al. | |
| 5,346,861 A | 9/1994 | Khandros et al. | |
| 5,612,576 A | 3/1997 | Wilson et al. | |
| 5,710,071 A | 1/1998 | Beddingfield et al. | |
| 6,383,846 B1 | 5/2002 | Shen et al. | |
| 6,417,029 B1 | 7/2002 | Fjelstad | |
| 6,483,328 B1 * | 11/2002 | Eldridge et al. | 324/754.18 |
| 6,693,239 B2 | 2/2004 | Myers et al. | |
| 6,730,541 B2 | 5/2004 | Heinen et al. | |
| 6,812,718 B1 * | 11/2004 | Chong et al. | 324/754.07 |
| 6,828,810 B2 * | 12/2004 | Kanamaru et al. | 324/750.25 |
| 6,853,209 B1 * | 2/2005 | Jovanovic et al. | 324/755.05 |
| 6,991,969 B2 | 1/2006 | Johnson | |

(Continued)

FOREIGN PATENT DOCUMENTS

| | | |
|---|---|---|
| JP | 61-194750 | 8/1986 |
| JP | 63-151053 | 6/1988 |

(Continued)

*Primary Examiner* — Tung X Nguyen
*Assistant Examiner* — Raul Rios Russo
(74) *Attorney, Agent, or Firm* — Perkins Coie LLP

(57) ABSTRACT

Methods and apparatus for testing unsingulated integrated circuits on a wafer include adapting a wafer prober for use with full-wafer-contacter disposed on the wafer. Some embodiments include placing wafer on a chuck of the prober, aligning the wafer to a full-wafer contacter incorporated in the wafer prober, removably attaching the wafer to the full wafer contacter, separating the wafer from the chuck, and making electrical contact to one or more integrated circuits of the wafer by making physical contact with a surface of the full-wafer contacter that faces away from the wafer.

14 Claims, 36 Drawing Sheets

(56) References Cited

U.S. PATENT DOCUMENTS

| | | |
|---|---|---|
| 7,245,137 B2 * | 7/2007 | Eldridge et al. ......... 324/754.07 |
| 7,282,931 B2 | 10/2007 | Johnson |
| 7,572,132 B2 * | 8/2009 | Johnson et al. ............... 439/152 |
| 8,294,481 B2 * | 10/2012 | Akahoshi et al. ........ 324/755.01 |
| 2002/0135395 A1 * | 9/2002 | Smith et al. ................... 324/770 |
| 2005/0225346 A1 * | 10/2005 | Saito et al. .................... 324/760 |
| 2007/0296449 A1 * | 12/2007 | Johnson ........................ 324/765 |
| 2008/0018341 A1 * | 1/2008 | Johnson ........................ 324/555 |
| 2008/0018350 A1 * | 1/2008 | Chao et al. .................... 324/754 |
| 2008/0230927 A1 * | 9/2008 | Johnson et al. ............... 257/782 |
| 2009/0102497 A1 * | 4/2009 | Ito et al. ........................ 324/757 |

FOREIGN PATENT DOCUMENTS

| | | |
|---|---|---|
| JP | 03-042858 | 2/1991 |
| JP | 05-226487 | 9/1993 |
| JP | 06-029416 | 2/1994 |

* cited by examiner ns are tested to determine which die, or integrated circuits, on the wafer are capable of operating according to predetermined specifications.

WAFER PROBER INTEGRATED WITH FULL-WAFER CONTACTOR

This non-provisional application is a continuation of U.S. patent application Ser. No. 12/404,277, filed Mar. 12, 2009, titled "Wafer Prober Integrated With Full-Wafer Contacter," which application claims the benefit of provisional application 61/069,457, filed 13 Mar. 2008, and entitled "Wafer Prober Integrated With Full-Wafer Contacter", the entirety of each of which are hereby incorporated by reference.

FIELD OF THE INVENTION

The present invention relates generally to semiconductor test equipment, and more particularly relates to methods and apparatus for routing electrical conductors to and from integrated circuits, microelectromechanical systems (MEMS), or similar structures in a test environment.

BACKGROUND

Advances in semiconductor manufacturing technology have resulted in, among other things, reducing the cost of sophisticated electronics to the extent that integrated circuits have become ubiquitous in the modern environment.

As is well-known, integrated circuits are typically manufactured in batches, and these batches usually contain a plurality of semiconductor wafers within and upon which integrated circuits are formed through a variety of semiconductor manufacturing steps, including, for example, depositing, masking, patterning, implanting, etching, planarizing and so on.

Completed wafers are tested to determine which die, or integrated circuits, on the wafer are capable of operating according to predetermined specifications. In this way, integrated circuits that cannot perform as desired are not packaged, or otherwise incorporated into finished products.

It is common to manufacture integrated circuits on roughly circular semiconductor substrates, or wafers. Further, it is common to form such integrated circuits so that conductive regions disposed on, or close to, the uppermost layers of the integrated circuits are available to act as terminals for connection to various electrical elements disposed in, or on, the lower layers of those integrated circuits. In testing, these conductive regions are commonly contacted with a probe card.

It is common to mount the wafer on a moveable chuck, which is used to achieve accurate positioning and to hold the wafer in place during testing. Often, a device such as a flexible membrane probe is brought into contact with a chuck-mounted wafer via a gasket seal. However, there is a tendency for the wafer to conform to the planar profile of the chuck, as the pressure that forms the contacts between the membrane and the wafer is supplied by the vertical movement of the chuck and the downward pressure of the vacuum. In full-wafer test, small irregularities in the planar profile of the chuck can adversely affect the ability of the wafer and the tester interface to form consistent electrical connections. The significance of these irregularities is amplified at higher pin counts and larger diameters.

What is needed are methods and apparatus that enable the wafer to achieve coplanarity with the tester interface.

SUMMARY OF THE INVENTION

Briefly, methods and apparatus for testing unsingulated integrated circuits on a wafer include adapting a wafer prober for use with a full-wafer-contacter disposed on the wafer. Some embodiments include placing a wafer on a chuck of the prober, aligning the wafer to a full-wafer contacter incorporated in the wafer prober, removably attaching the wafer to the full wafer contacter, separating the wafer from the chuck, and making electrical contact to one or more integrated circuits of the wafer by making physical contact with a surface of the full-wafer contacter that faces away from the wafer.

DETAILED DESCRIPTION

Figure 1:
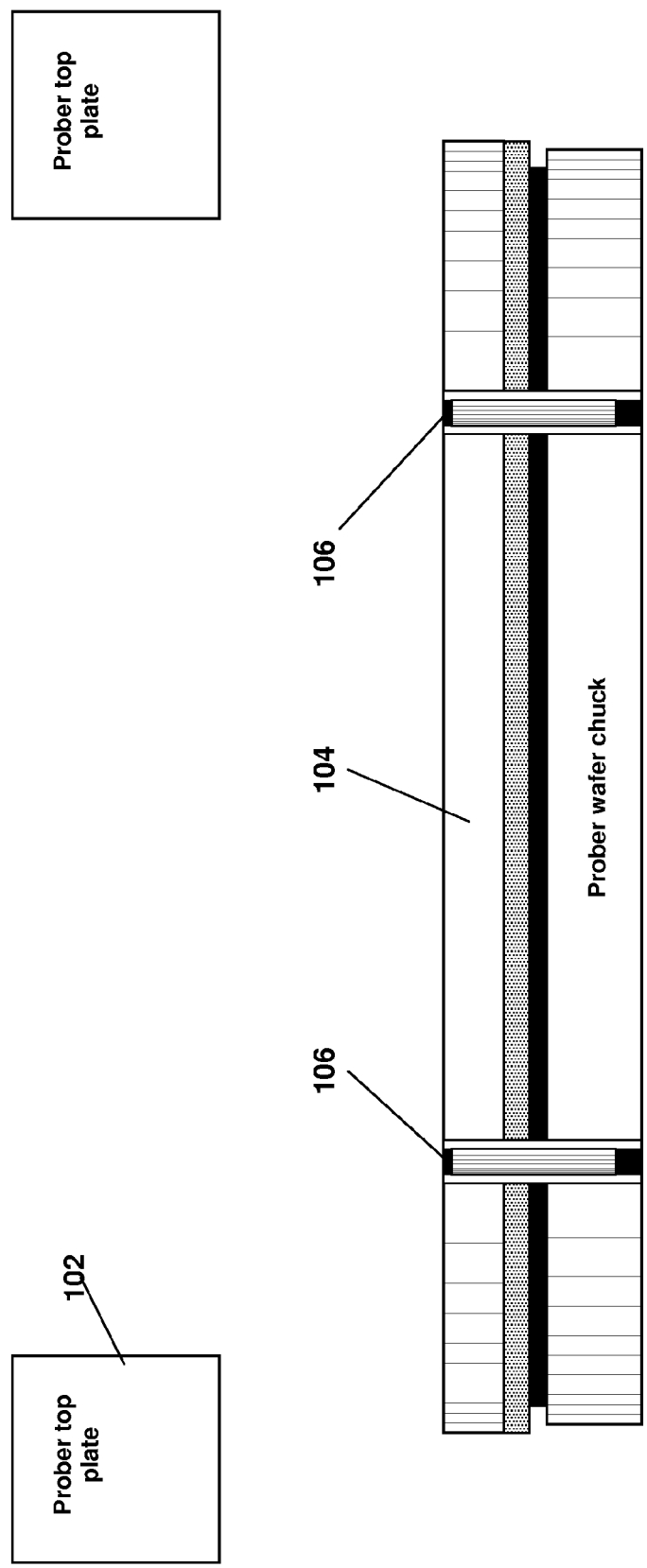
FIGS. 1-36 are cross-sectional views of a wafer prober adapted for use with a full-wafer contacter in various states of use, all in accordance with the present invention.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Terminology

Reference herein to "circuit boards", unless otherwise noted, is intended to include any type of substrate upon which circuits may be placed. For example, such substrates may be rigid or flexible, ceramic, flex, epoxy, FR4, or any other suitable material.

Pad refers to a metallized region of the surface of an integrated circuit, which is used to form a physical connection terminal for communicating signals to and/or from the integrated circuit.

The expression "wafer translator" refers to an apparatus facilitating the connection of I/O pads (sometimes referred to as terminals, pads, contact pads, bonding pads, chip pads, or test pads) of unsingulated integrated circuits, to other electrical components. It will be appreciated that "I/O pads" is a general term, and that the present invention is not limited with regard to whether a particular pad of an integrated circuit is part of an input, output, or input/output circuit. A wafer translator may be disposed between a wafer and other electrical components. The wafer translator includes a substrate having two major surfaces, each surface having terminals disposed thereon, and electrical pathways disposed through the substrate to provide for electrical continuity between at least one terminal on a first surface and at least one terminal on a second surface. The wafer-side of the wafer translator has a pattern of terminals that matches the layout of at least a portion of the I/O pads of the integrated circuits on the wafer. The wafer translator, when disposed between a wafer and other electrical components, makes electrical contact with one or more I/O pads of a plurality of integrated circuits on the wafer, providing an electrical pathway therethrough to the other electrical components. The wafer translator is a structure that is used to achieve electrical connection between one or more electrical terminals that have been fabricated at a first scale, or dimension, and a corresponding set of electrical terminals that have been fabricated at a second scale, or dimension. The wafer translator provides an electrical bridge between the smallest features in one technology (e.g., pins of a probe card) and the largest features in another technology (e.g., bonding pads of an integrated circuit). For convenience, wafer translator is referred to simply as translator where there is no ambiguity as to its intended meaning.

The expression "edge extended wafer translator" refers to an embodiment of a translator in which electrical pathways disposed in and/or on the translator lead from terminals, which in use contact the wafer under test, to electrical terminals disposed outside of a circumferential edge of a wafer aligned for connection with, or attached to the edge extended translator.

The expression "translated wafer" refers to a wafer that has a wafer translator attached thereto, wherein a predetermined portion of, or all of, the contact pads of the integrated circuits on the wafer are in electrical contact with corresponding electrical connection means disposed on the wafer side of the translator. Typically, the wafer translator is removably attached to the wafer. Removable attachment may be achieved, for example, by means of vacuum, or pressure differential, attachment.

The terms chip, integrated circuit, semiconductor device, and microelectronic device are sometimes used interchangeably in this field. The present invention relates to the manufacture and test of chips, integrated circuits, semiconductor devices and microelectronic devices as these terms are commonly understood in the field.

Typically the wafer translator includes a plurality of electrically conductive wafer contact pads fabricated at a first scale and disposed on the wafer-side of the translator, and a plurality of electrically conductive wafer sort pads fabricated at a second scale and disposed on the tester-side of the translator. It is noted that electrically conductive wire pathways are disposed within the translator to connect wafer contact pads to the wafer sort pads. The translator may be mounted in a frame.

In some embodiments of the present invention, a wafer translator 702 capable of full-wafer contact, is mounted in a mounting fixture 704. Mounting fixture 704 is typically a fixed position mounting fixture. A wafer 1102 to be tested is vacuum-mounted on a movable chuck 104, then mechanically aligned with the wafer translator 702 which is held in the mounting fixture 704. Chucks with the ability to hold down a wafer by application of vacuum to the wafer backside are well-known to those skilled in this field. It is noted that the translator 702 and the wafer 1102 may be aligned via any number of alignment methods including, but not limited to, optical alignment. The chuck 104 is then raised so that the wafer 1102 and the translator 702 are in close proximity. A gasket 706, typically disposed near the outer circumference of the translator 702 separates the wafer 1102 and translator 702. A vacuum is drawn between the translator 702 and the vacuum-mounted wafer 1102. The vacuum between the wafer 1102 and the movable chuck 104 is then released. Vacuum pressure between the wafer 1102 and wafer translator 702 is increased to form electrical contact, resulting in a translated wafer (i.e., wafer/wafer translator pair). The translated wafer tends to conform to the rigid translator thus allowing for electrical contact between the wafer and the translator. This is different from conventional arrangements in which a wafer is held down on a rigid chuck and is therefore unable to conform to a full-wafer contacter.

In the illustrated embodiment of the present invention, the mounting fixture 704 has a "home" position in which it is removably coupled to a ring 302 surrounding the outer circumference of the chuck 104. The chuck can be raised so that the mounting fixture 704 holding the translator 702 is preferentially removeably attached to the underside of the prober top plate 102 using a top plate attachment 202.

Subsequent to removably attaching the wafer 1102 to the translator 702, i.e., forming the translated wafer, the mounting fixture 704, with the translator 702 and attached wafer 1102, are removed from the prober top plate and returned to the home position. At this point the wafer 1102 is held to the translator 702 and not to the chuck 104. However, once the mounting fixture 704 has been returned to its home position the chuck 104 is able to move in the x-y plane so that the contact pads on the tester-side of the translator 702 align with probes 602 of the wafer prober. Once aligned, the chuck moves up in the z-axis such that electrical contact is made between the probes and the contact pads on the tester-side of the translator 702. Electrical signals may now be communicated, through the translator 702, between at least one integrated circuit and a tester that is coupled to the wafer prober in accordance with the present invention.

In one embodiment, the present invention provides an apparatus for coupling a plurality of electrical pathways to a wafer, and includes a wafer prober, the wafer prober including a top plate and a vacuum hold down chuck; an attachment means disposed on an underside of the top plate; a vacuum source ring disposed around an outer circumference of the vacuum hold down chuck; and a wafer translator mechanically coupled to a mounting fixture; wherein the mounting fixture is removably attached to the attachment means.

FIG. 1 is a cross-sectional view and shows various known prober elements including a prober top plate 102, a wafer chuck 104, and lift pins 106.

Figure 2:
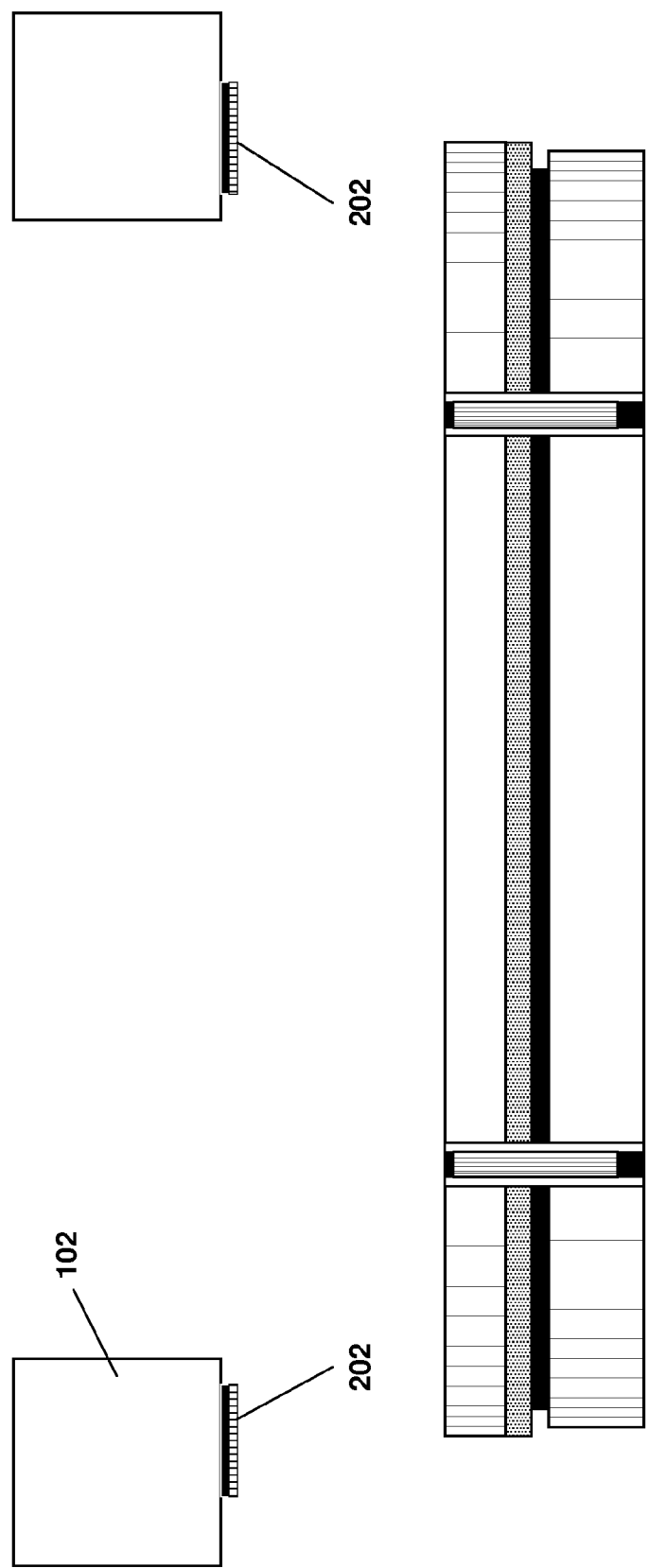

FIG. 2 is a cross-sectional view of a prober-based wafer contact system in accordance with the present invention, and shows the addition of the top plate attachment 202, which acts as an attachment point for the wafer translator mounting fixture.

Figure 3:
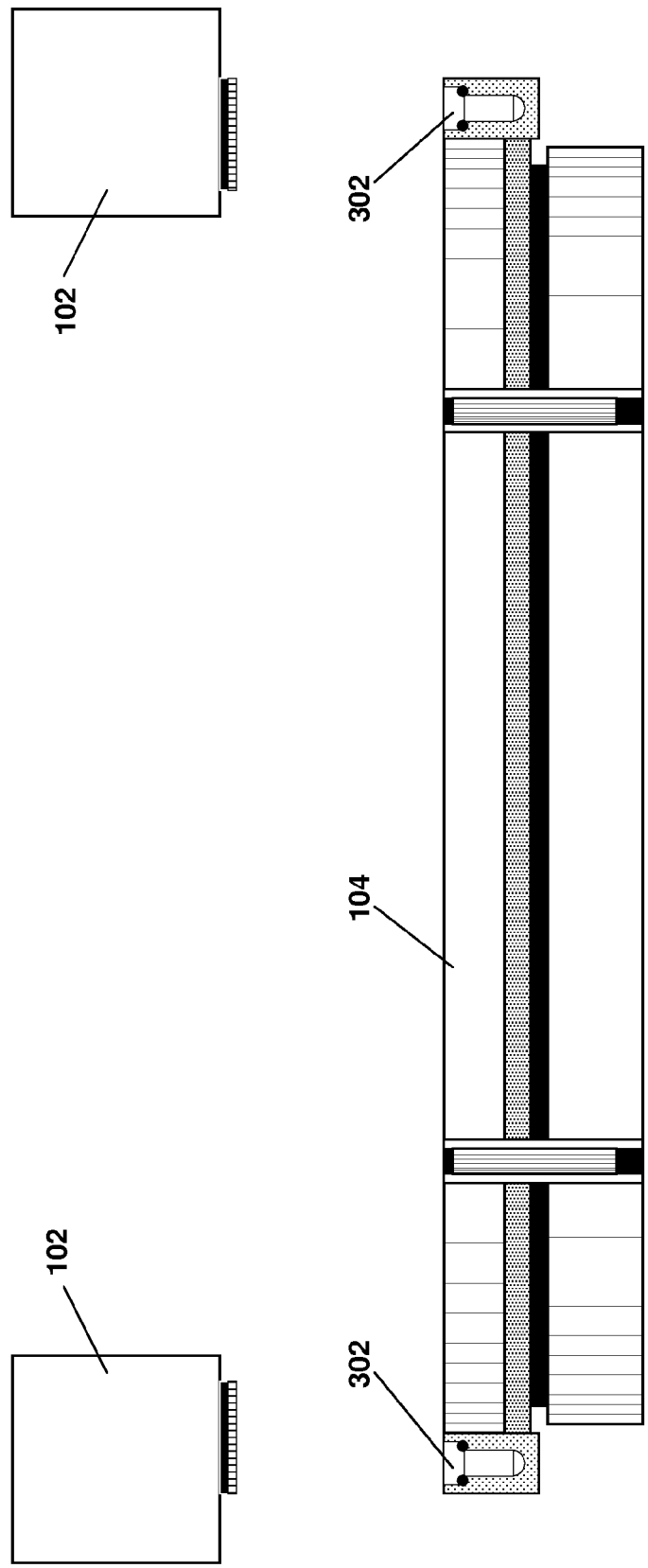

FIG. 3 is a cross-sectional view of a prober-based wafer contact system in accordance with the present invention, and shows the addition of prober kit element 302.

Figure 4:
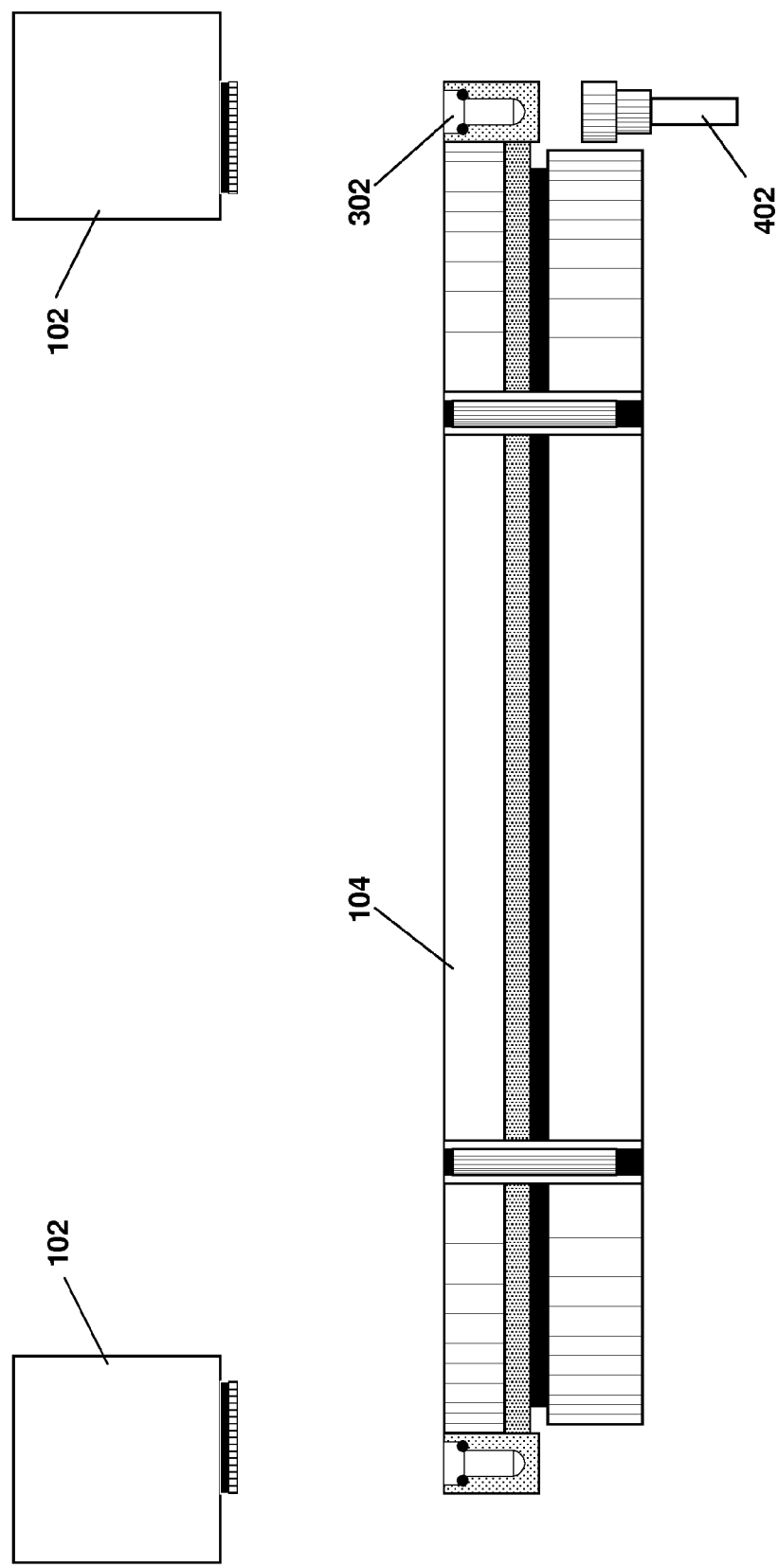

FIG. 4 is a cross-sectional view of a prober-based wafer contact system in accordance with the present invention, and shows the addition of prober kit element 402.

Figure 5:
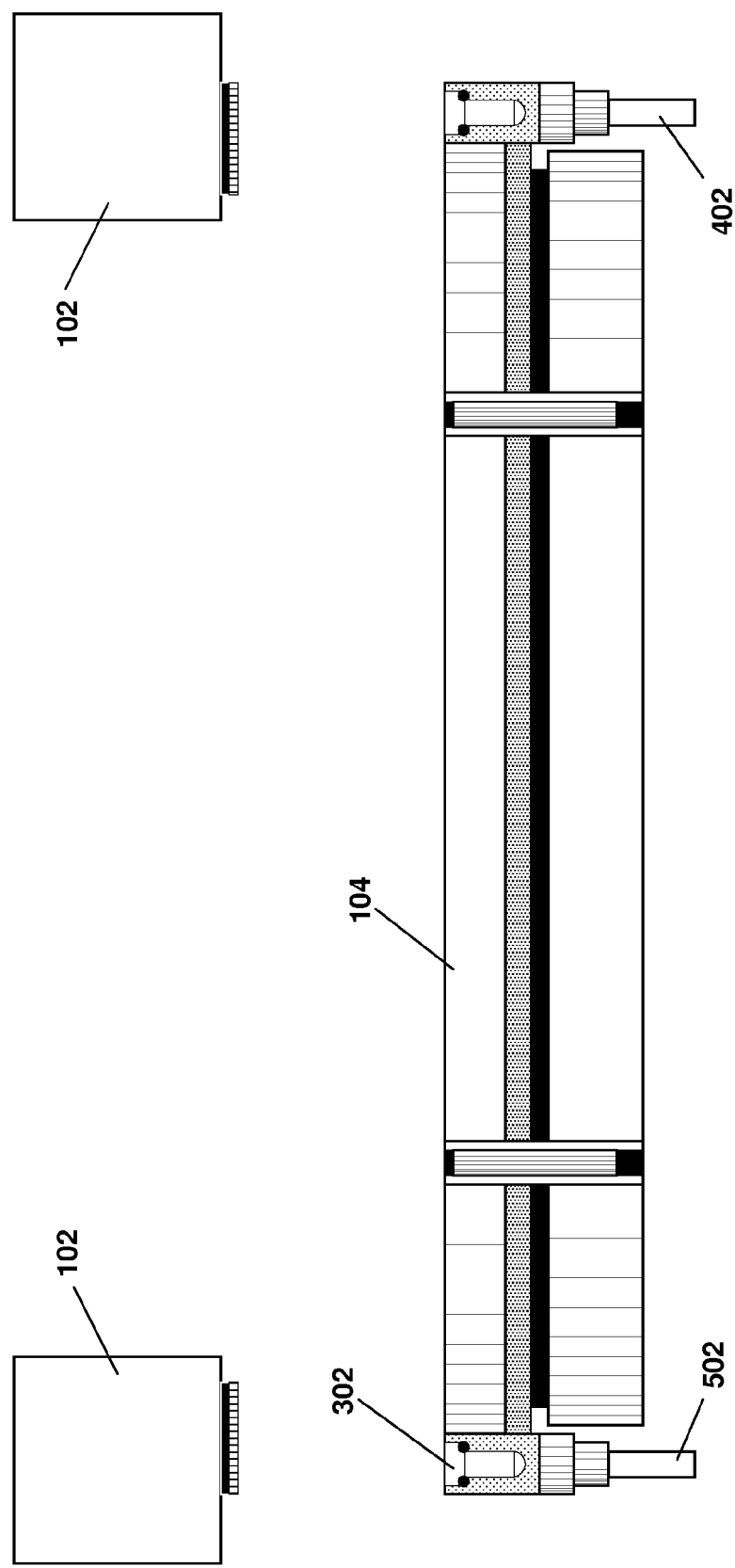

FIG. 5 is a cross-sectional view of a prober-based wafer contact system in accordance with the present invention, and shows the addition of prober kit element 502.

Figure 6:
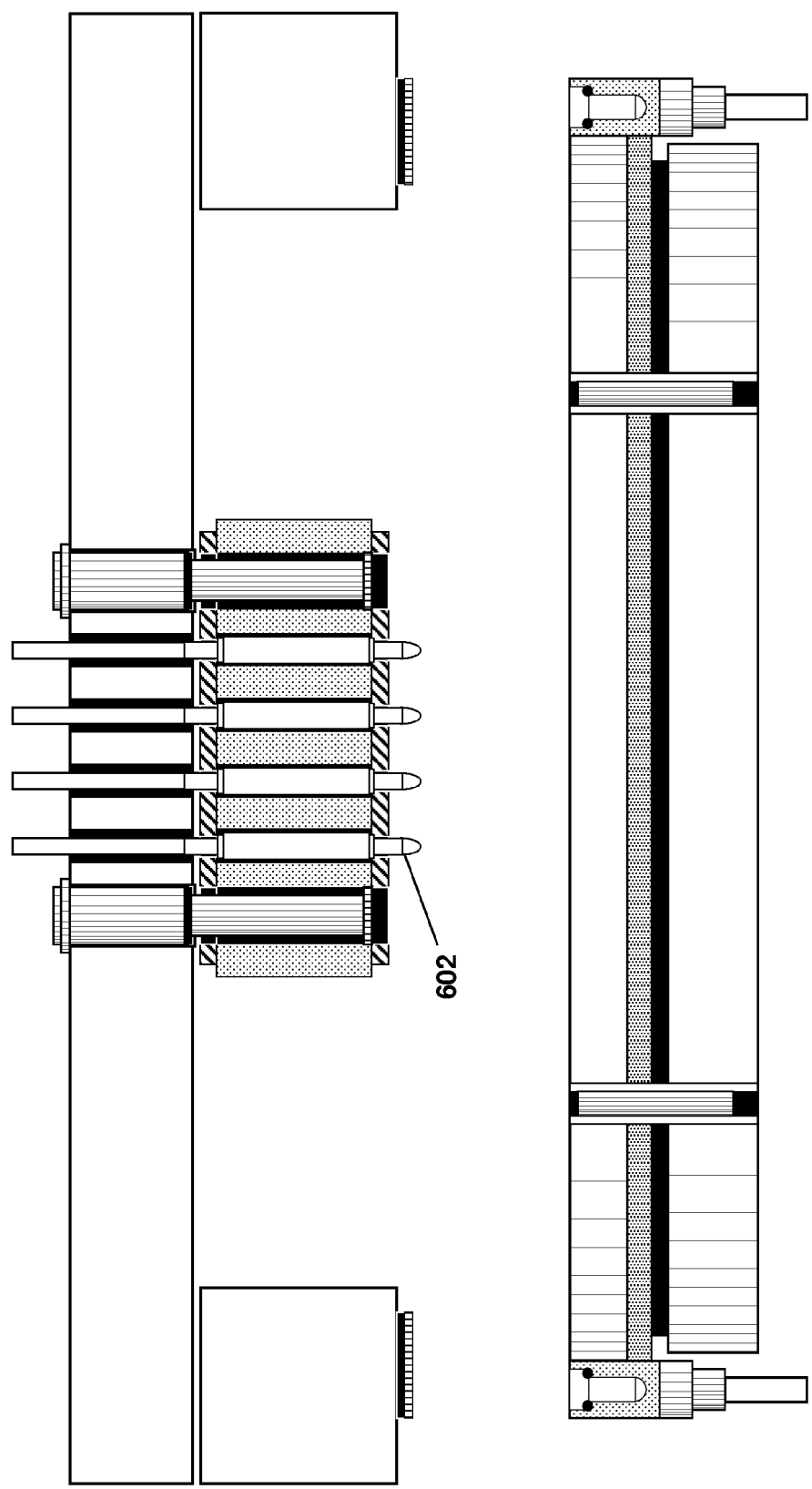
Figure 7:
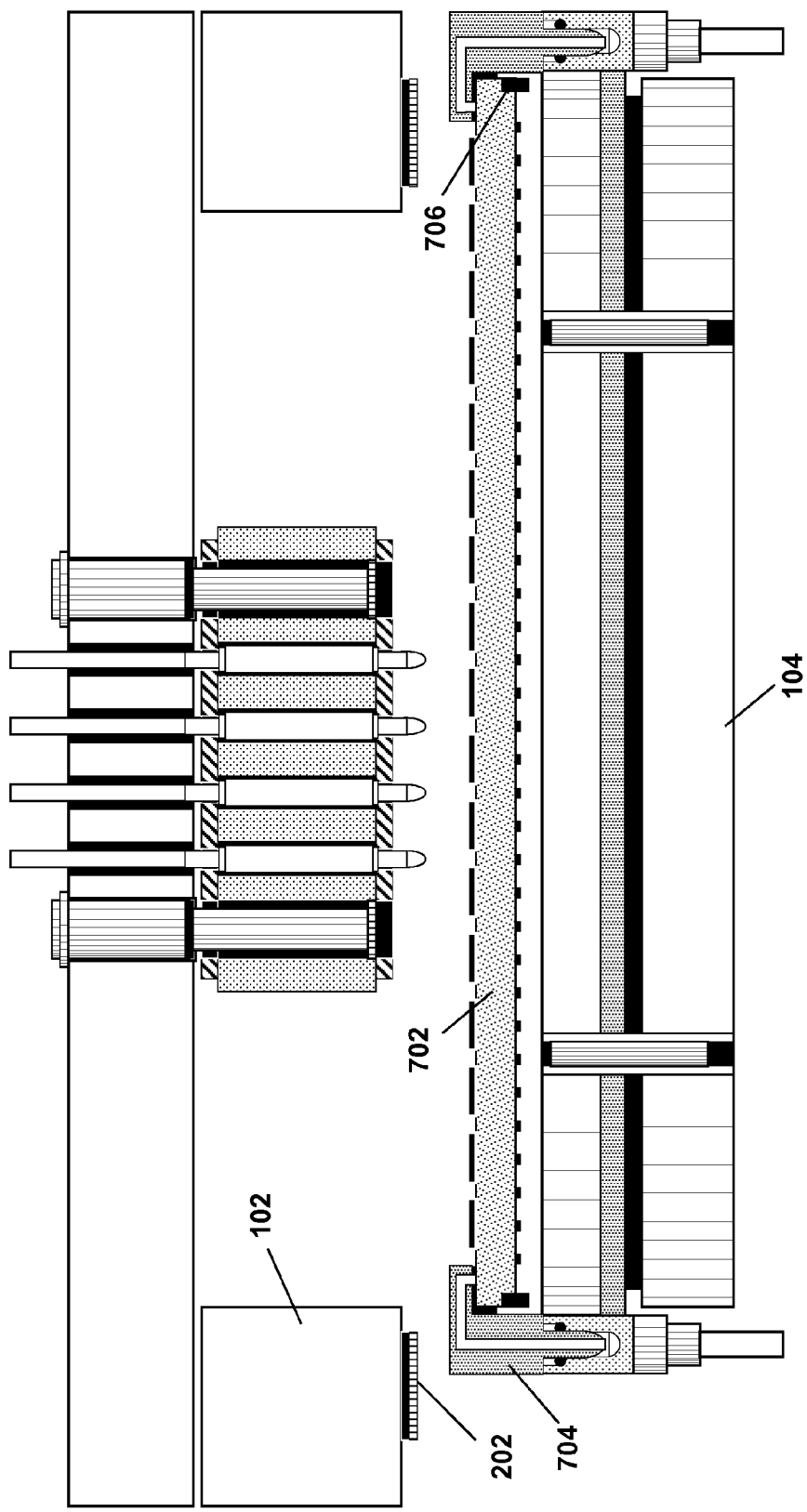
Figure 8:
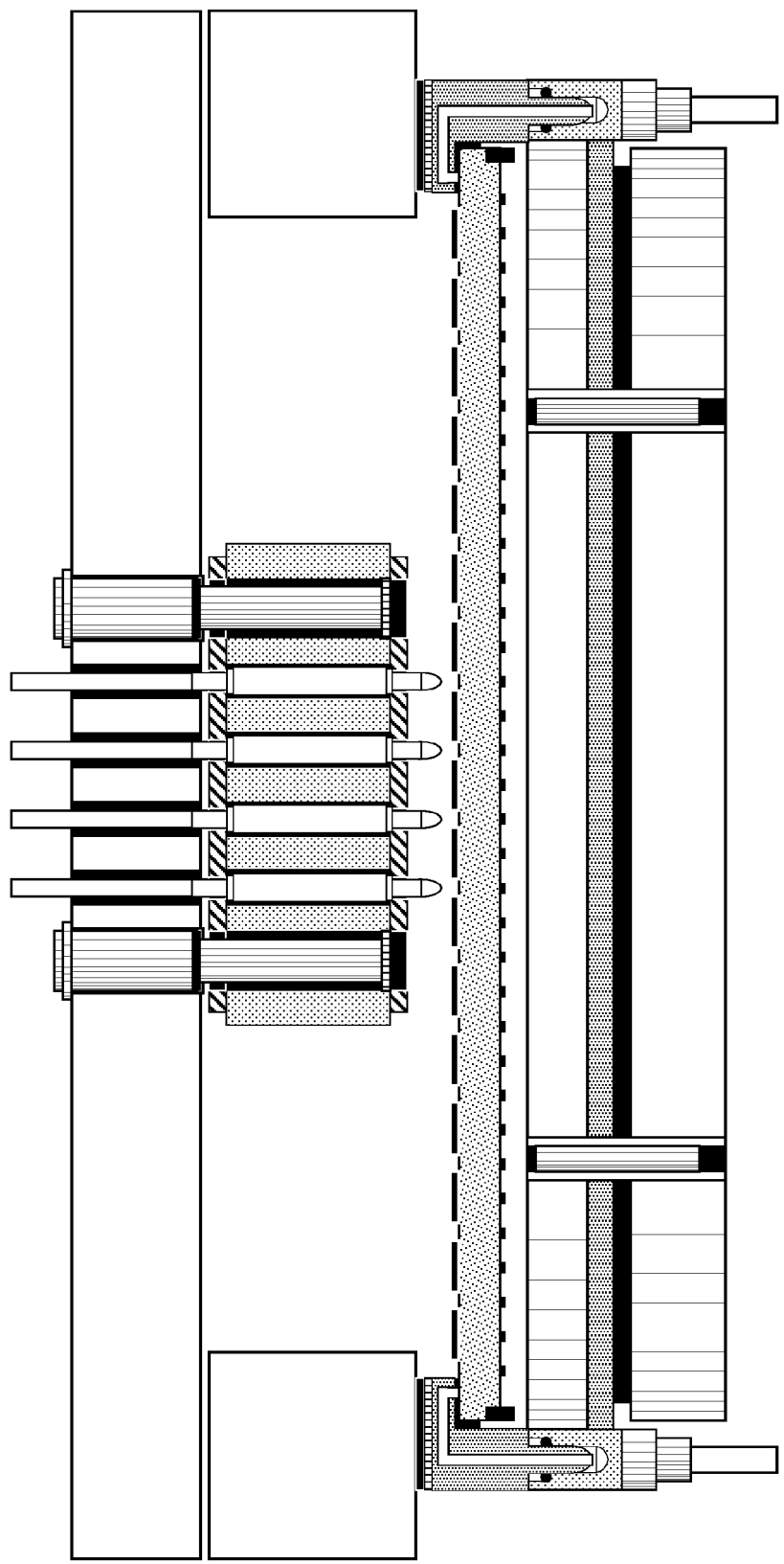
Figure 9:
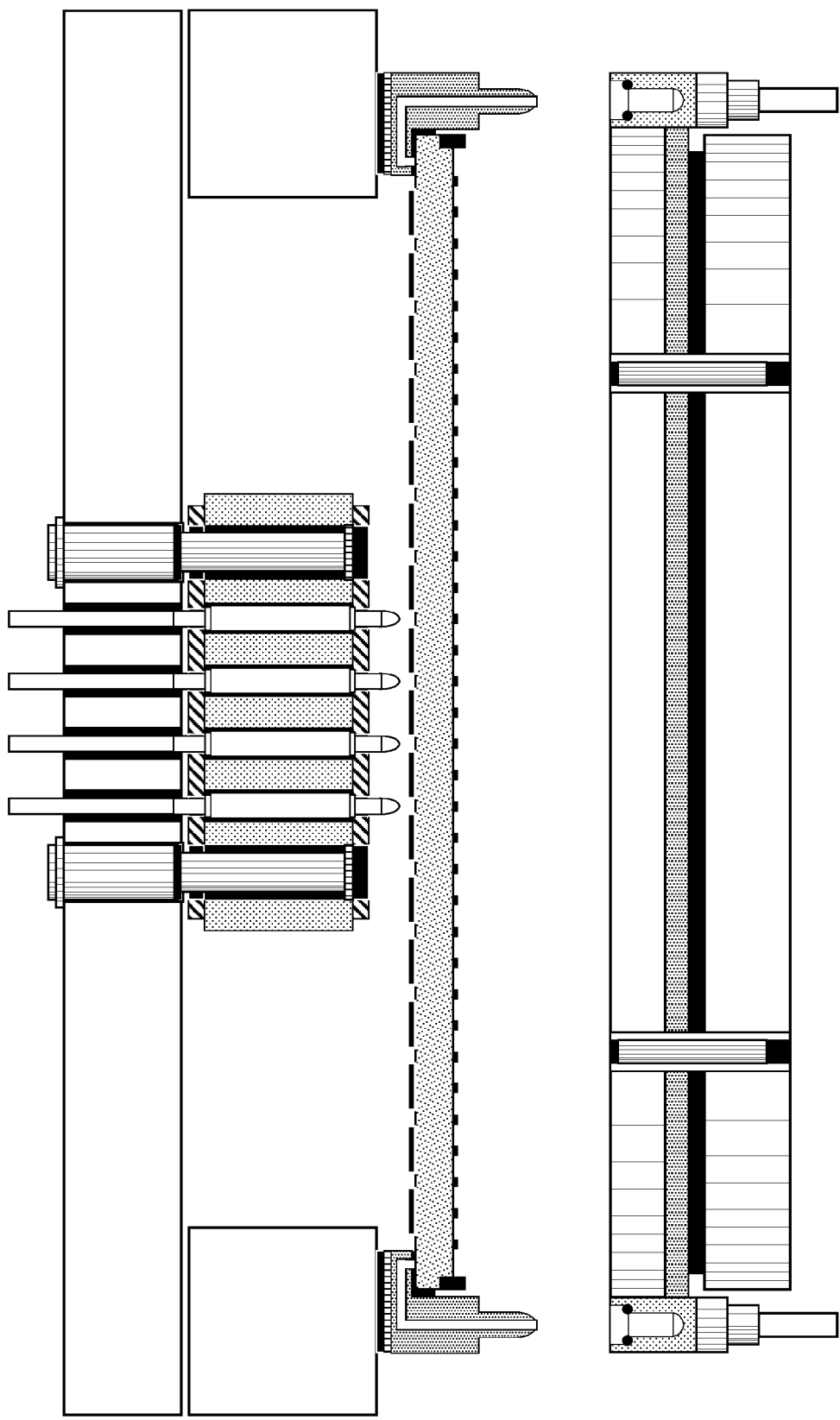
Figure 10:
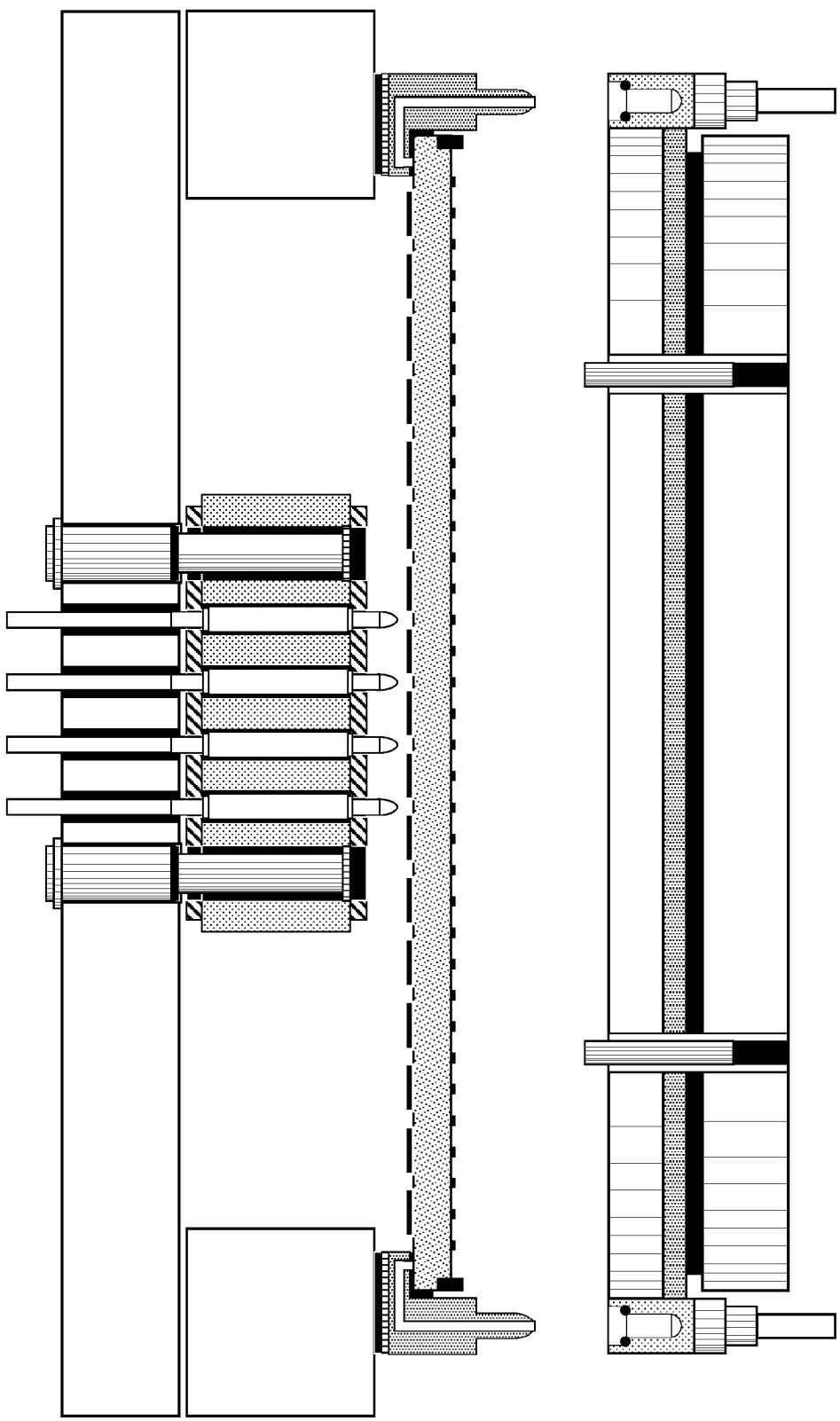
Figure 11:
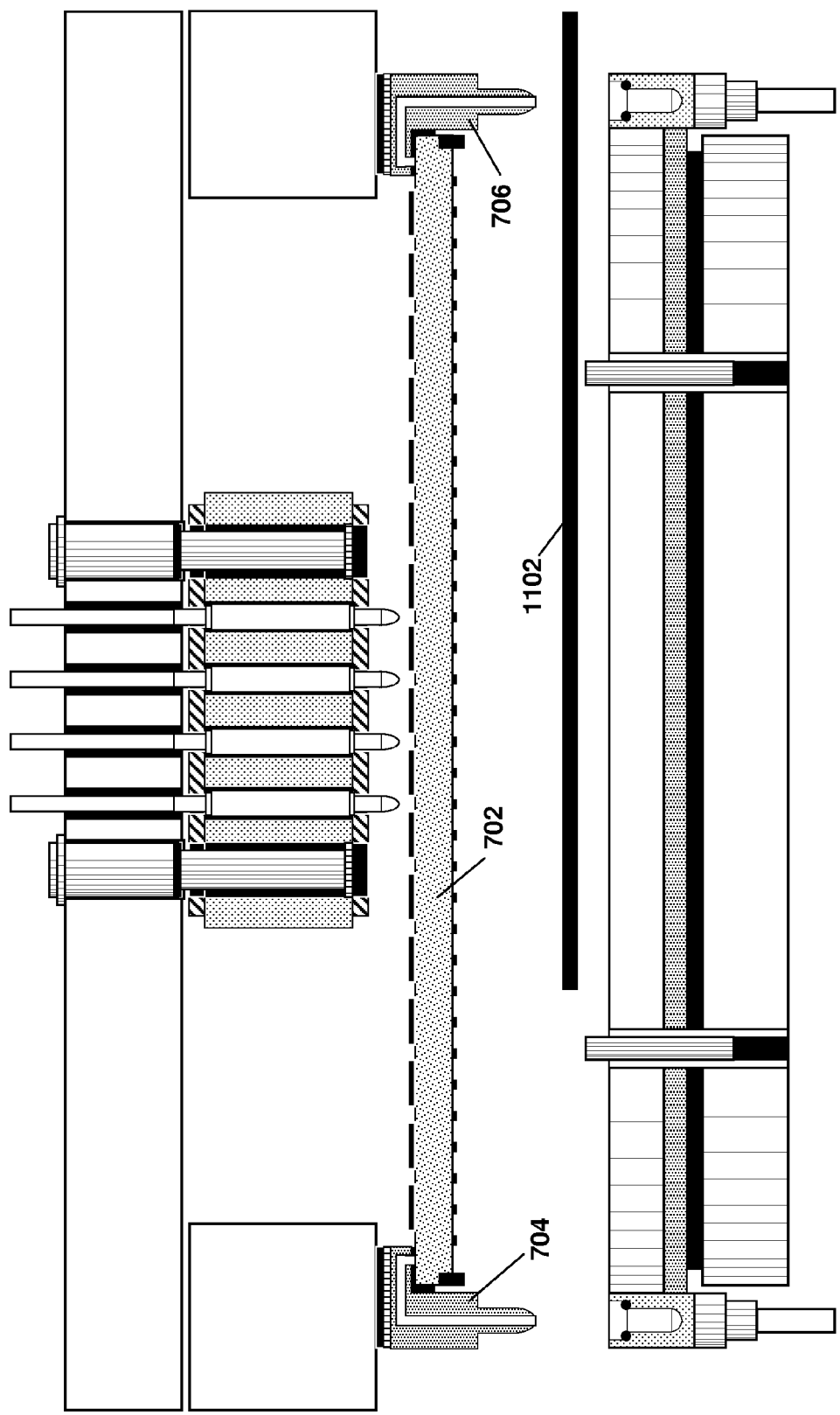
Figure 12:
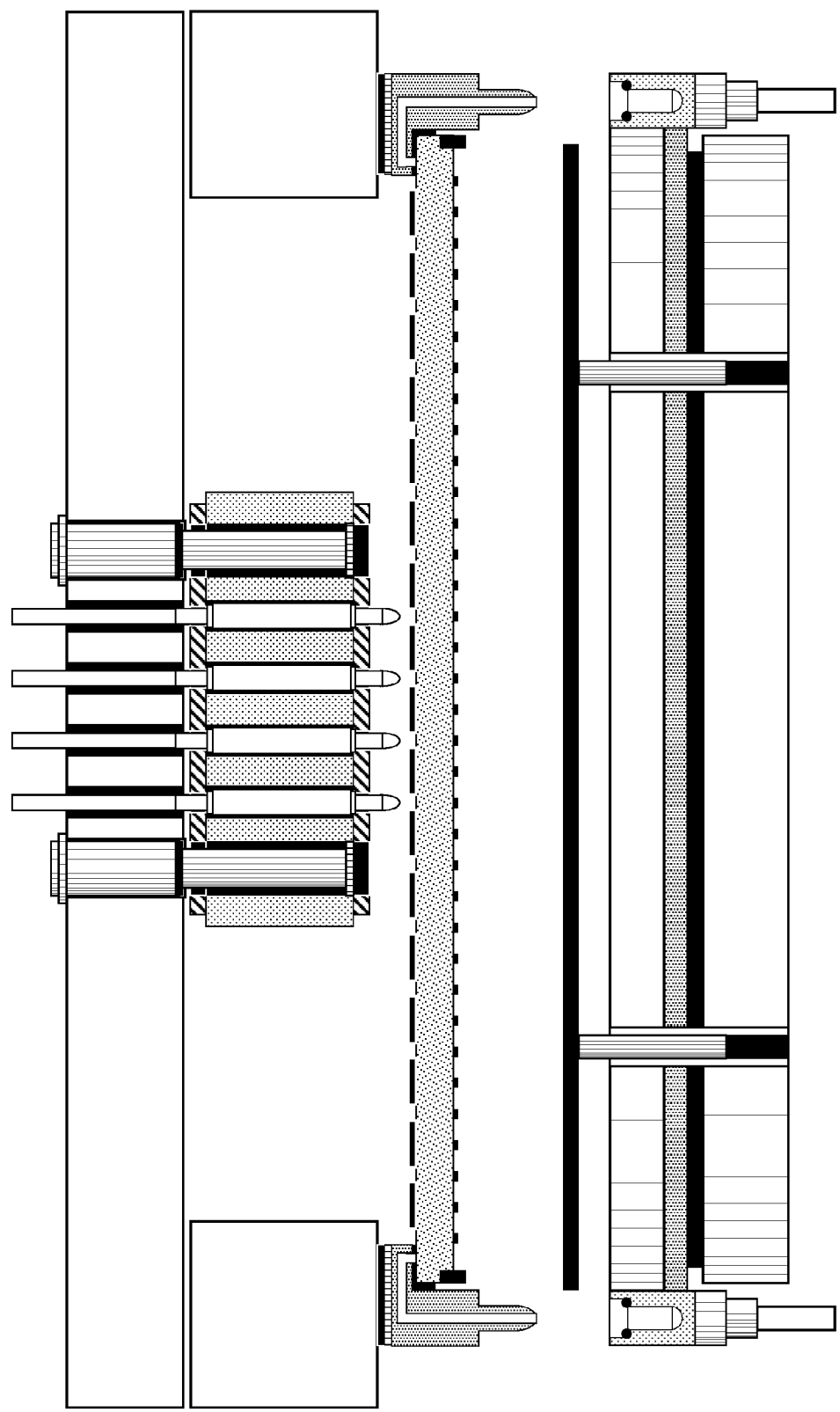
Figure 13:
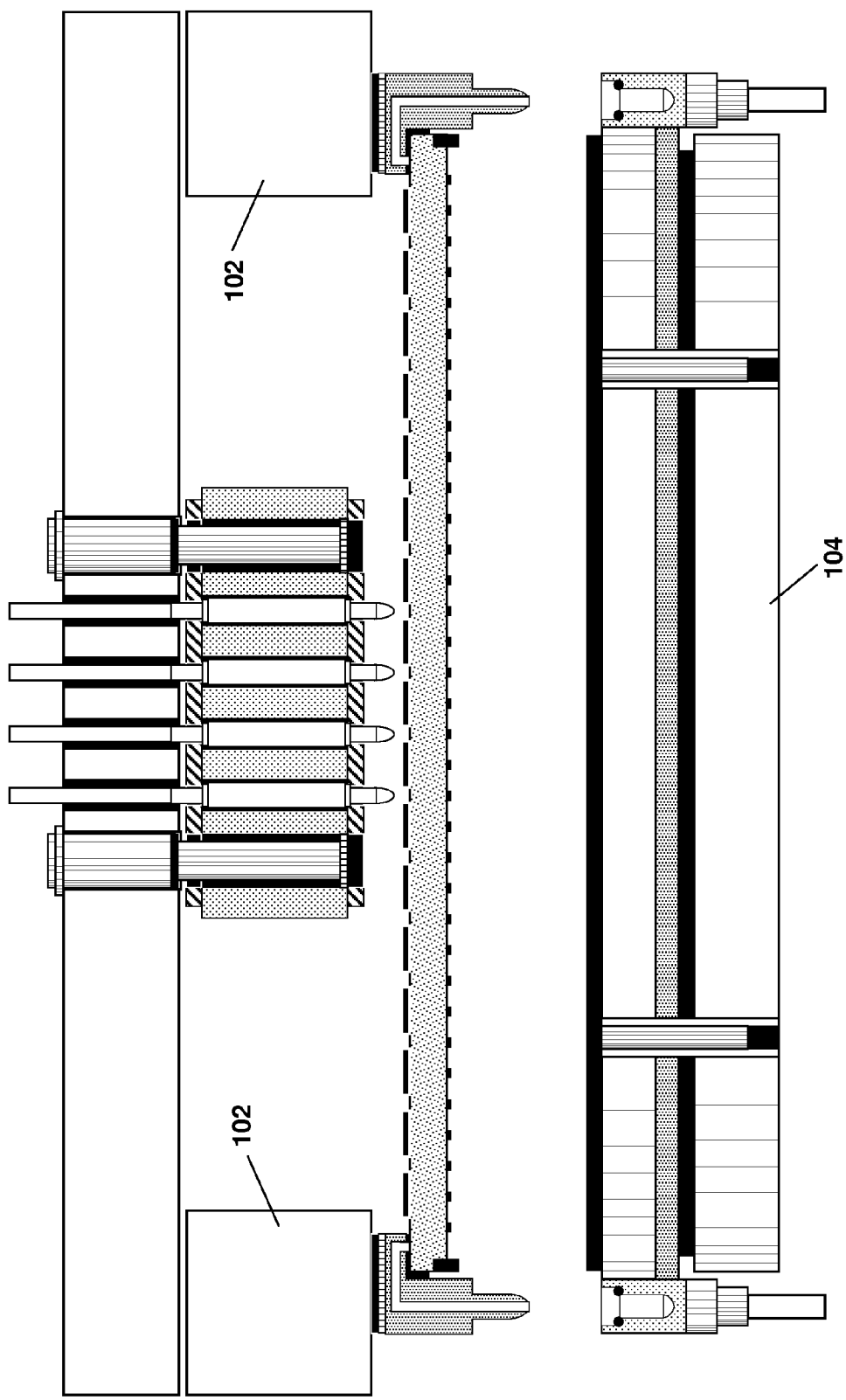
Figure 14:
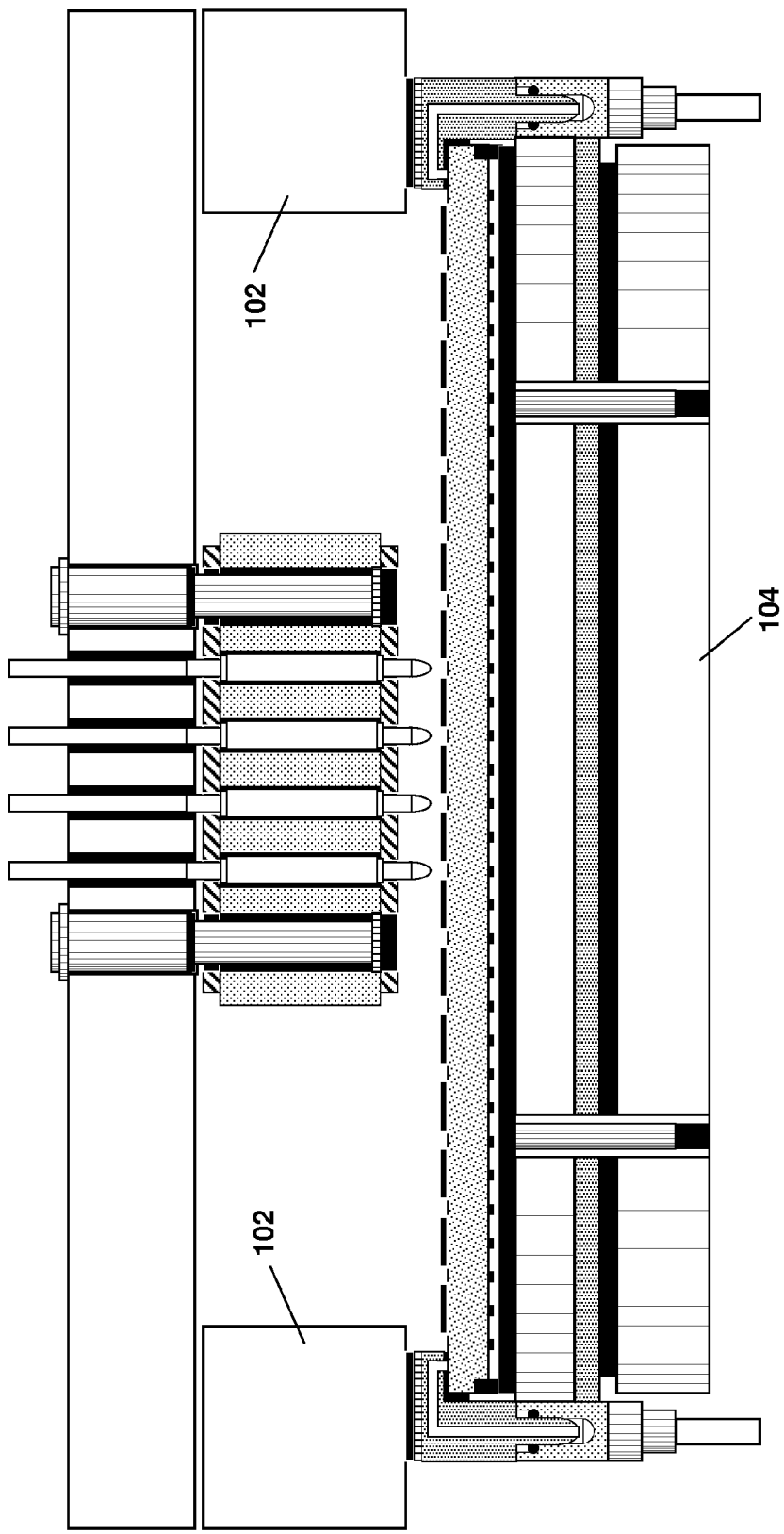
Figure 15:
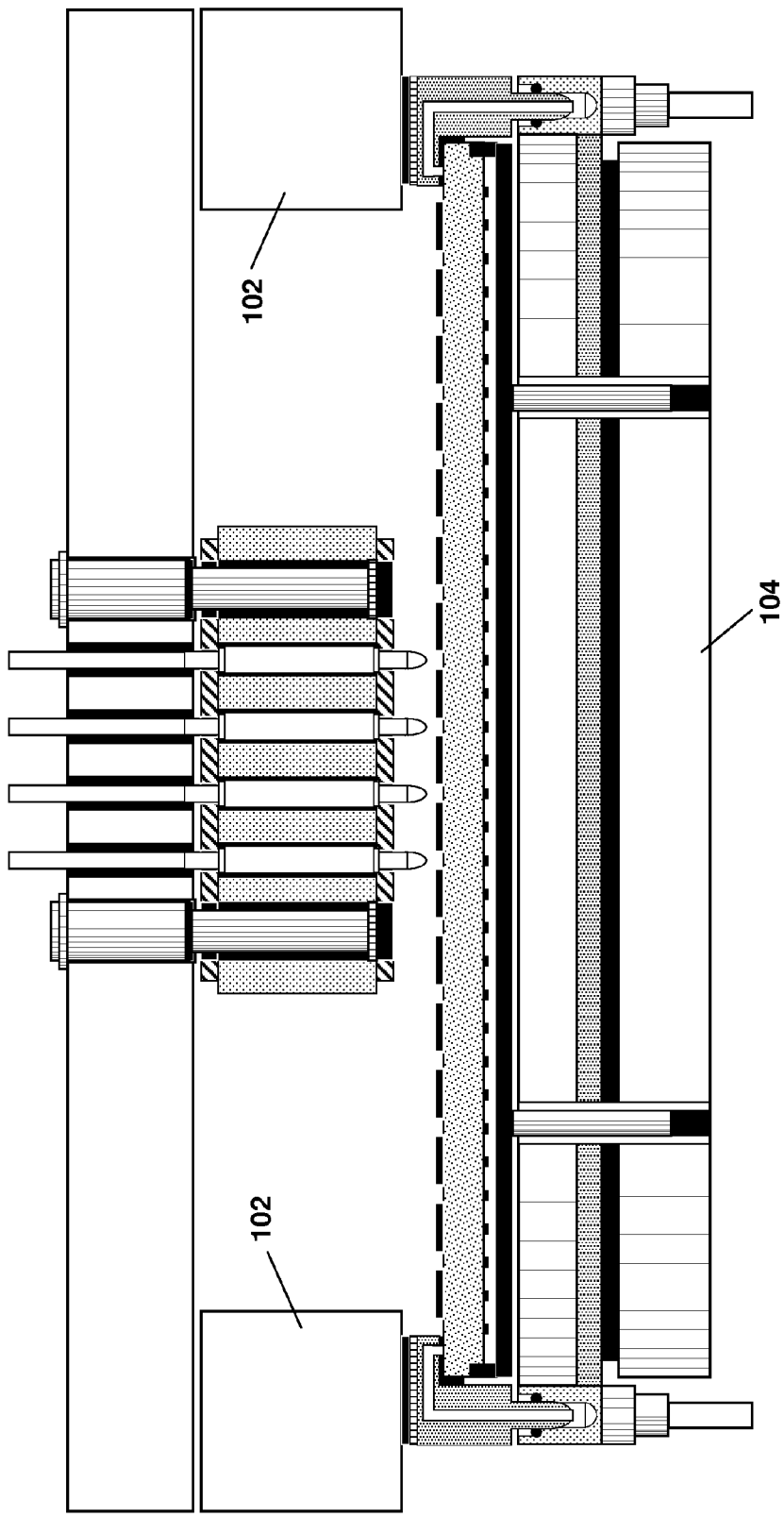
Figure 16:
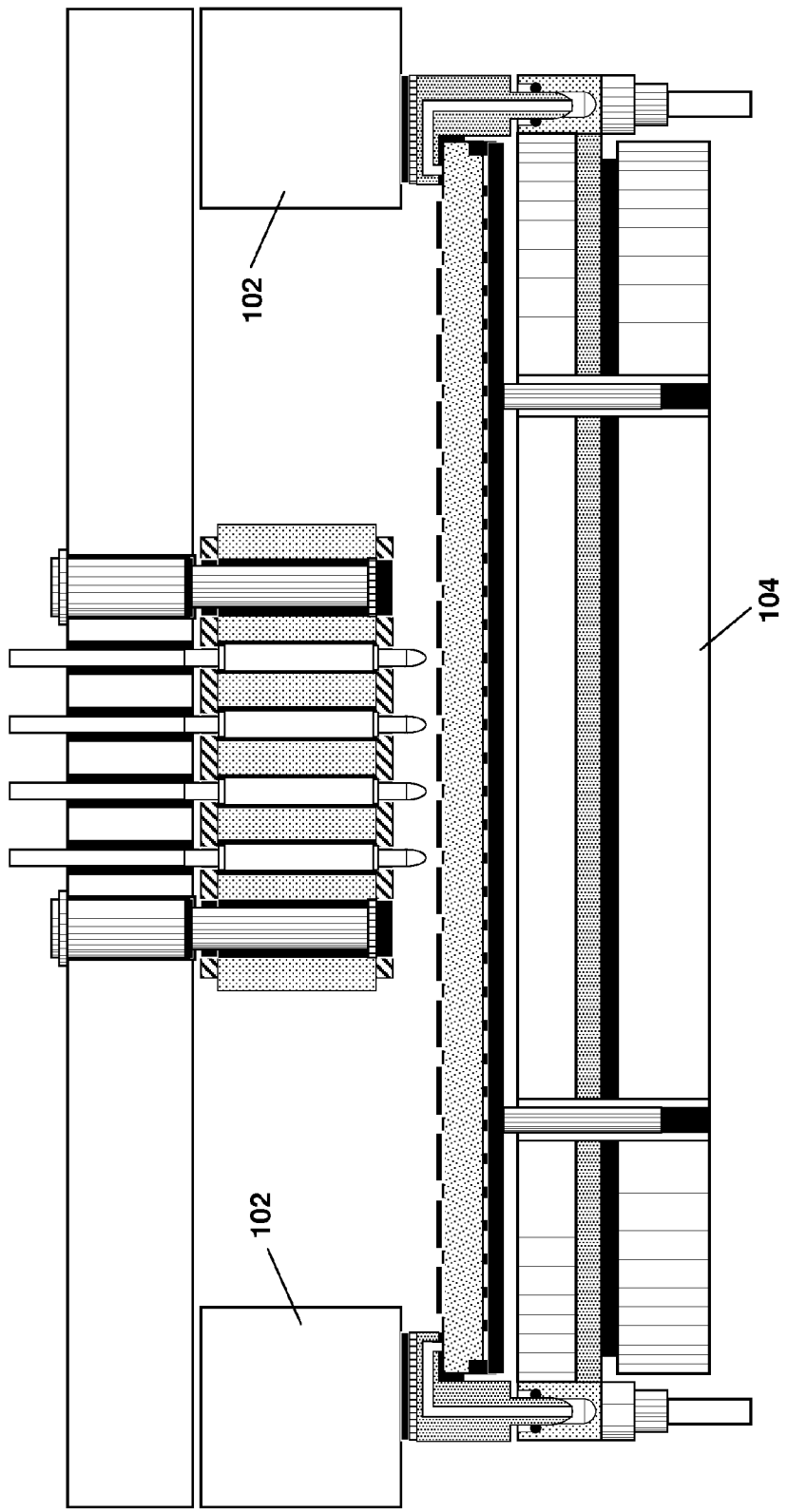
Figure 17:
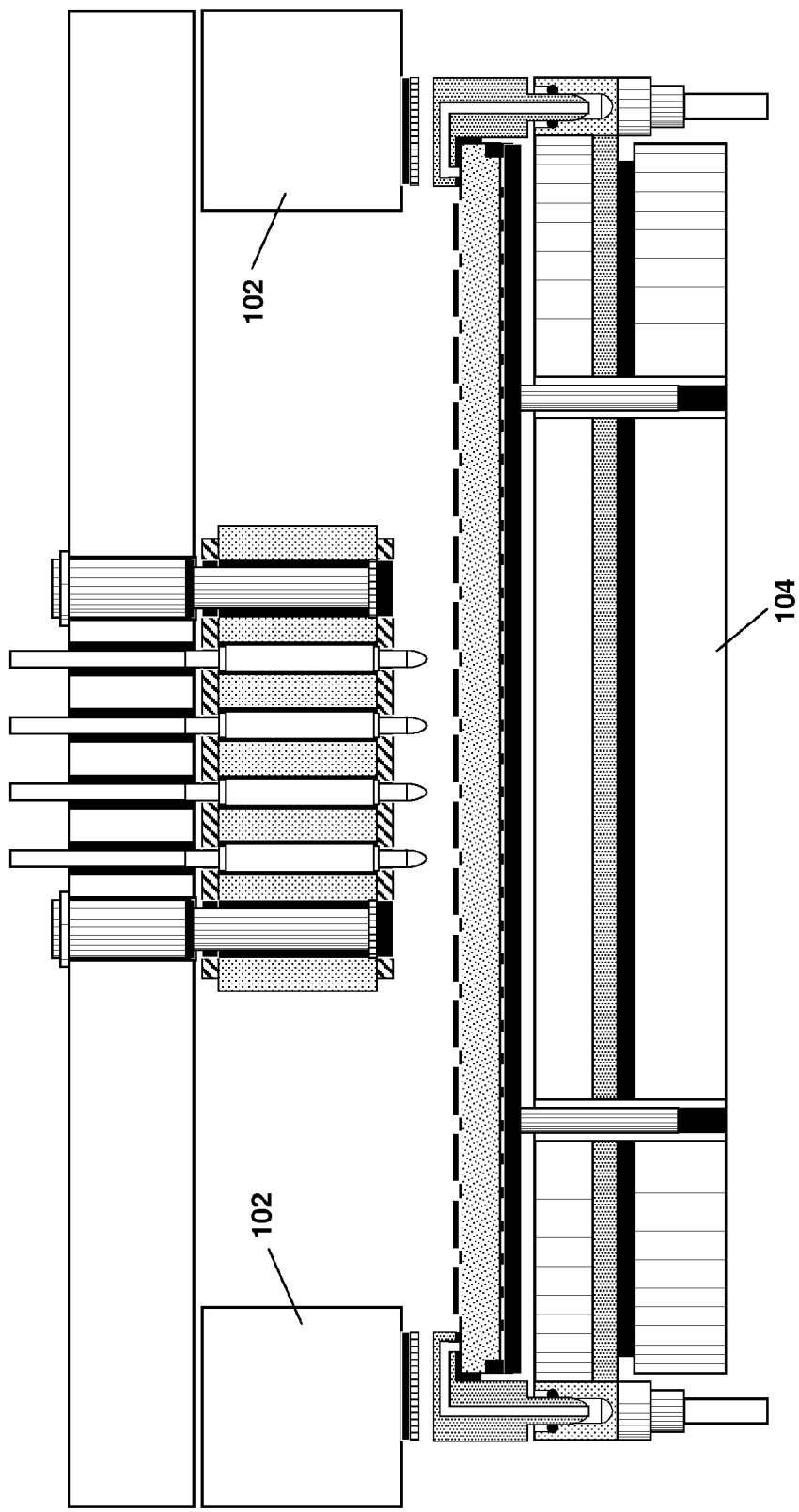
Figure 18:
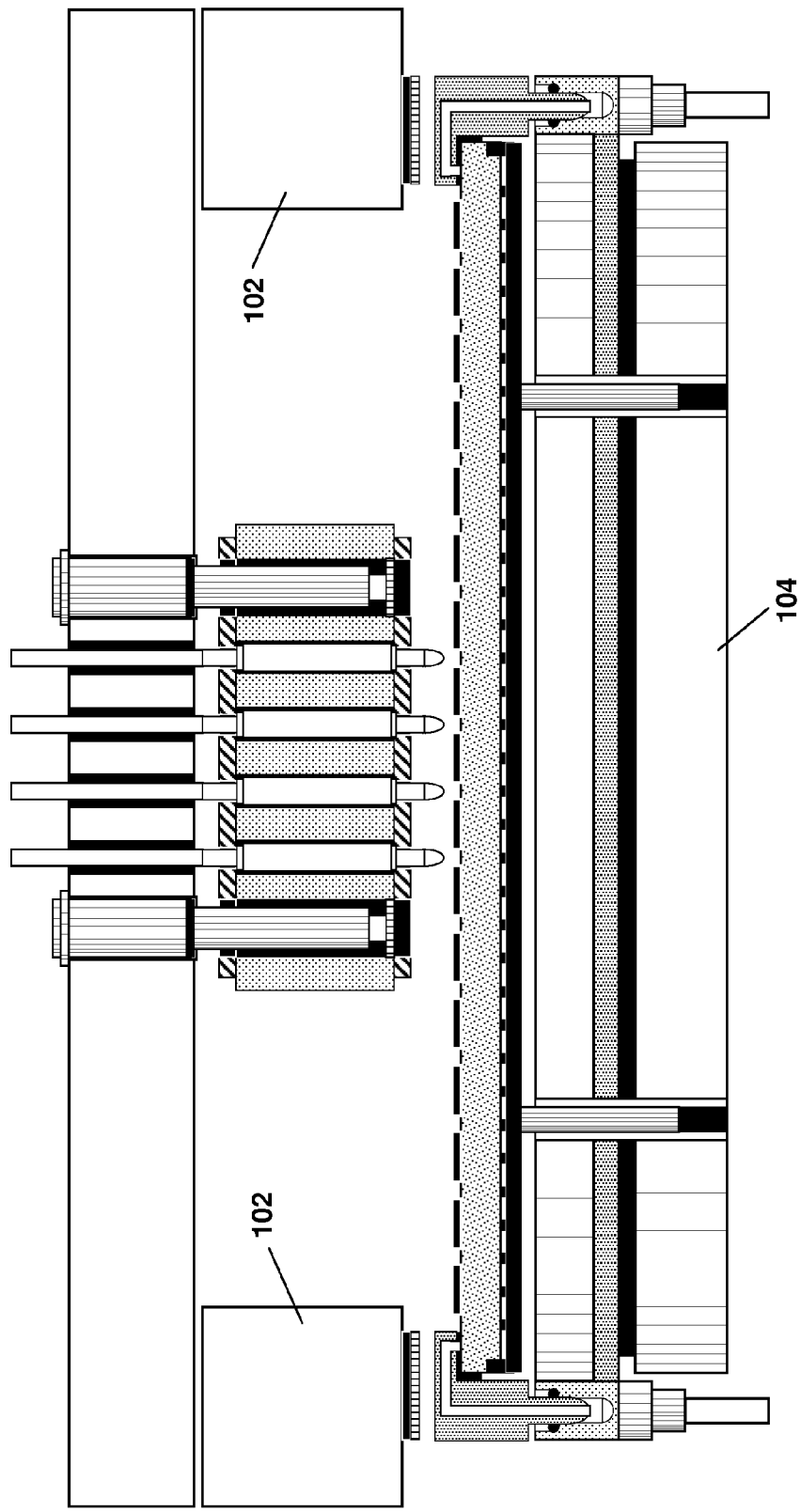
Figure 19:
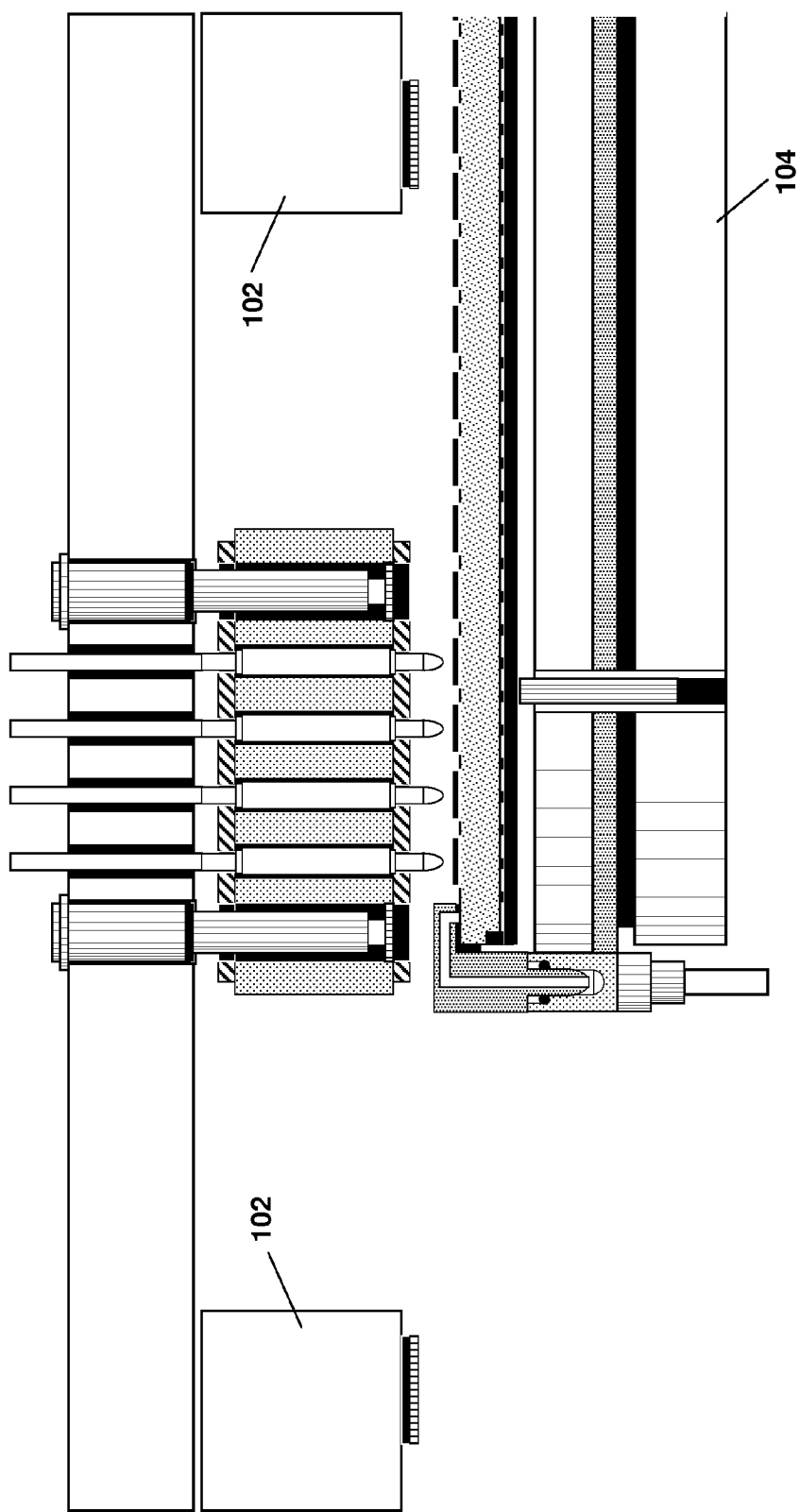
Figure 20:
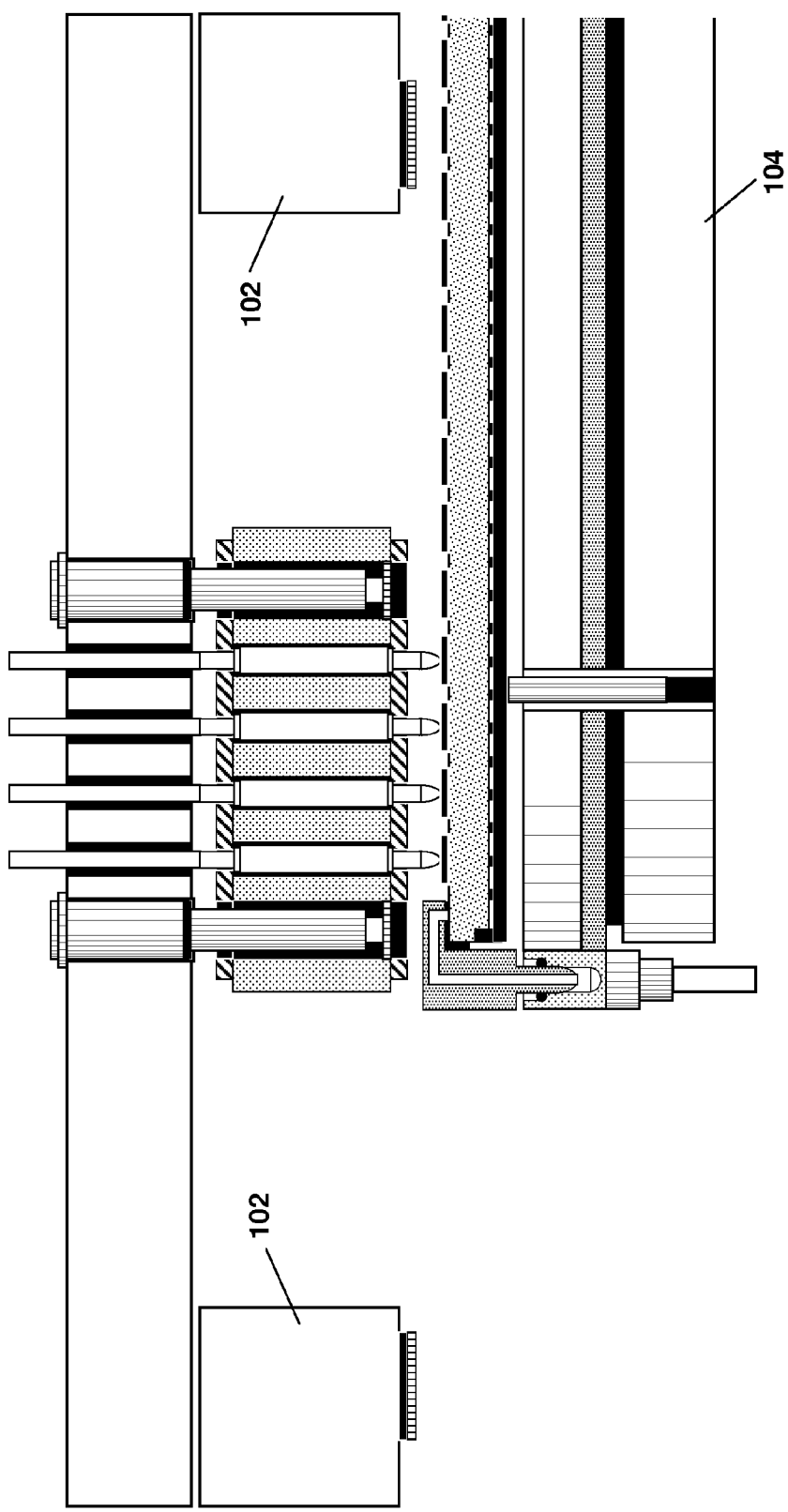
Figure 21:
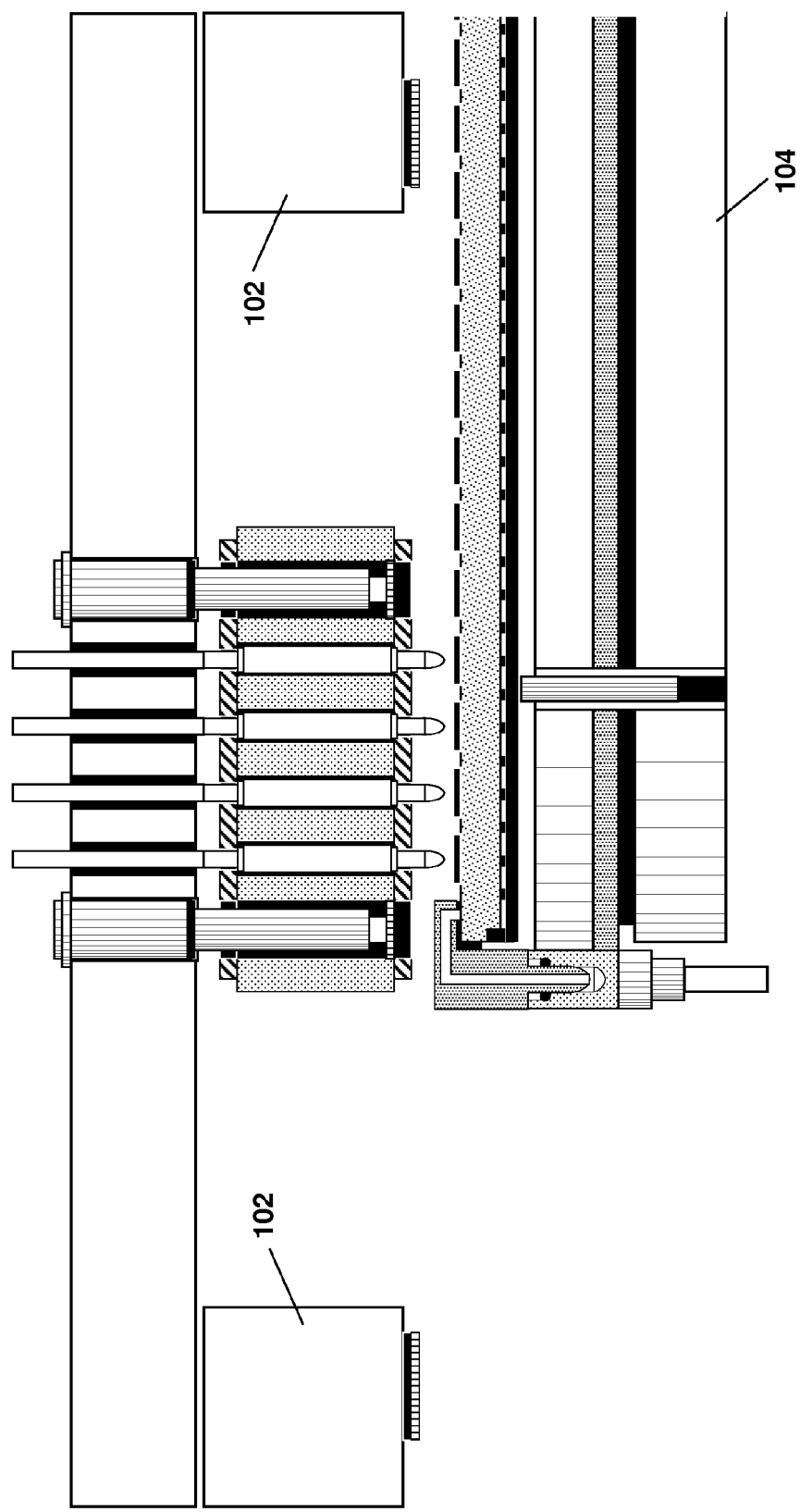
Figure 22:
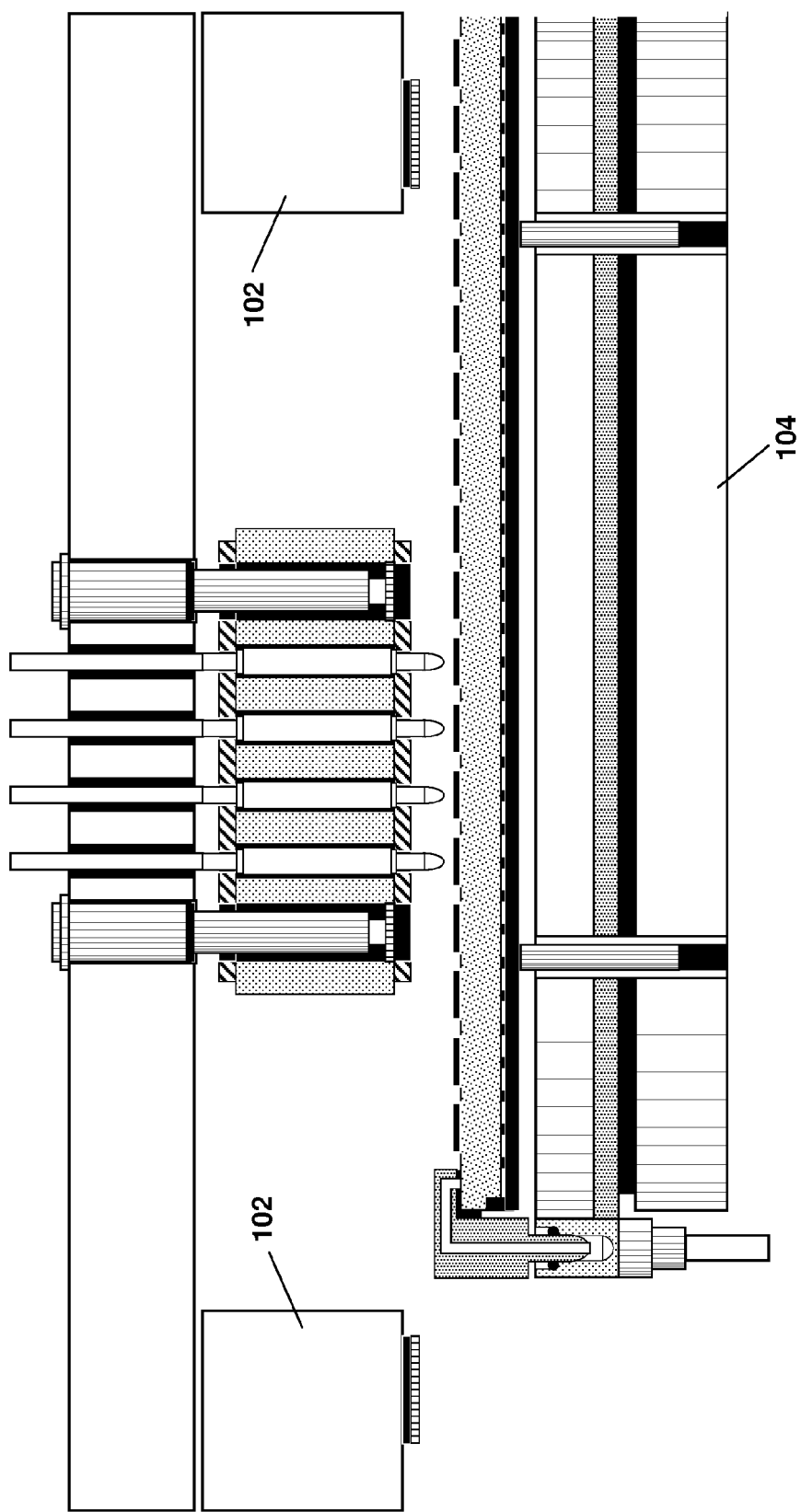
Figure 23:
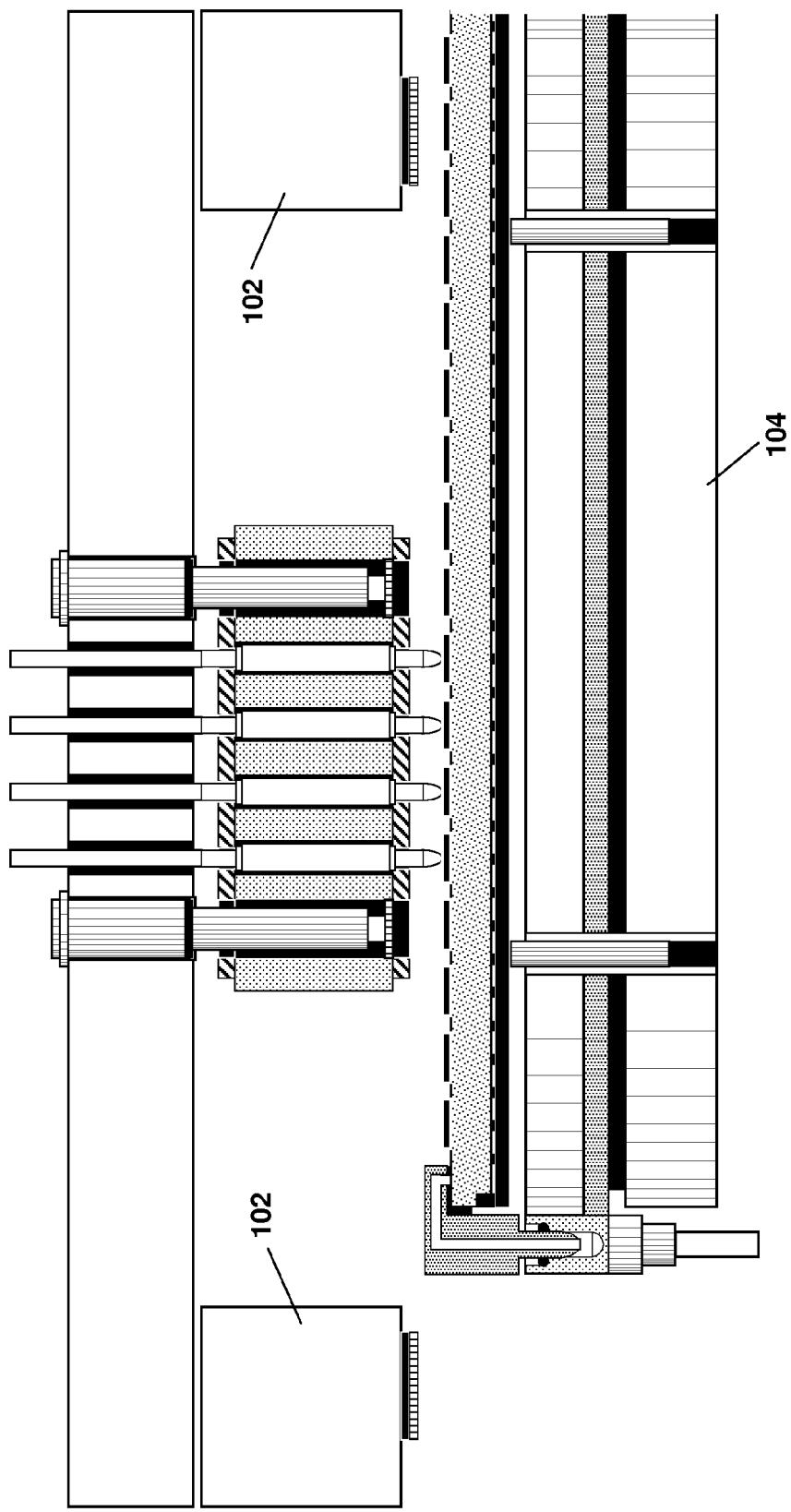
Figure 24:
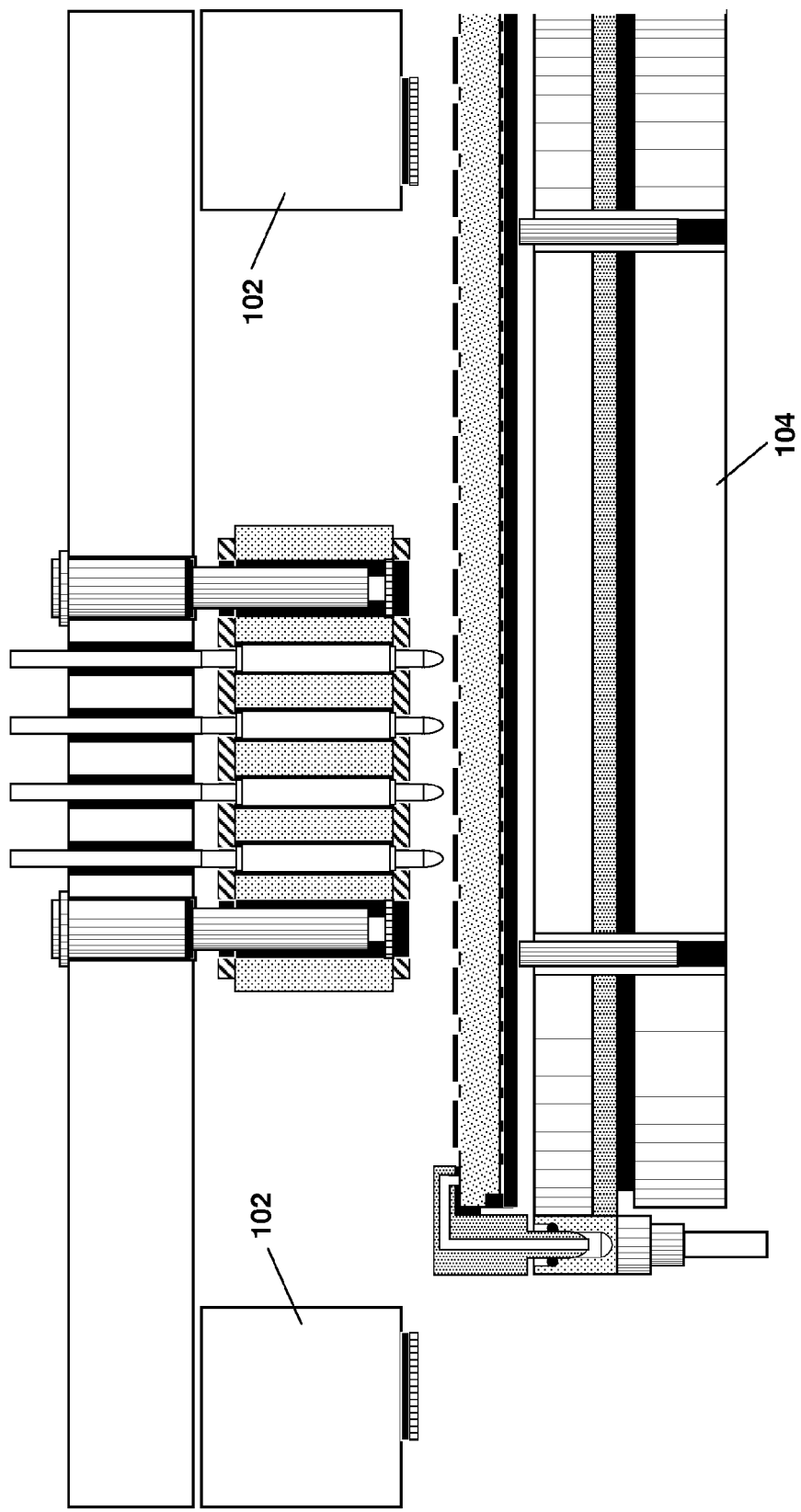
Figure 25:
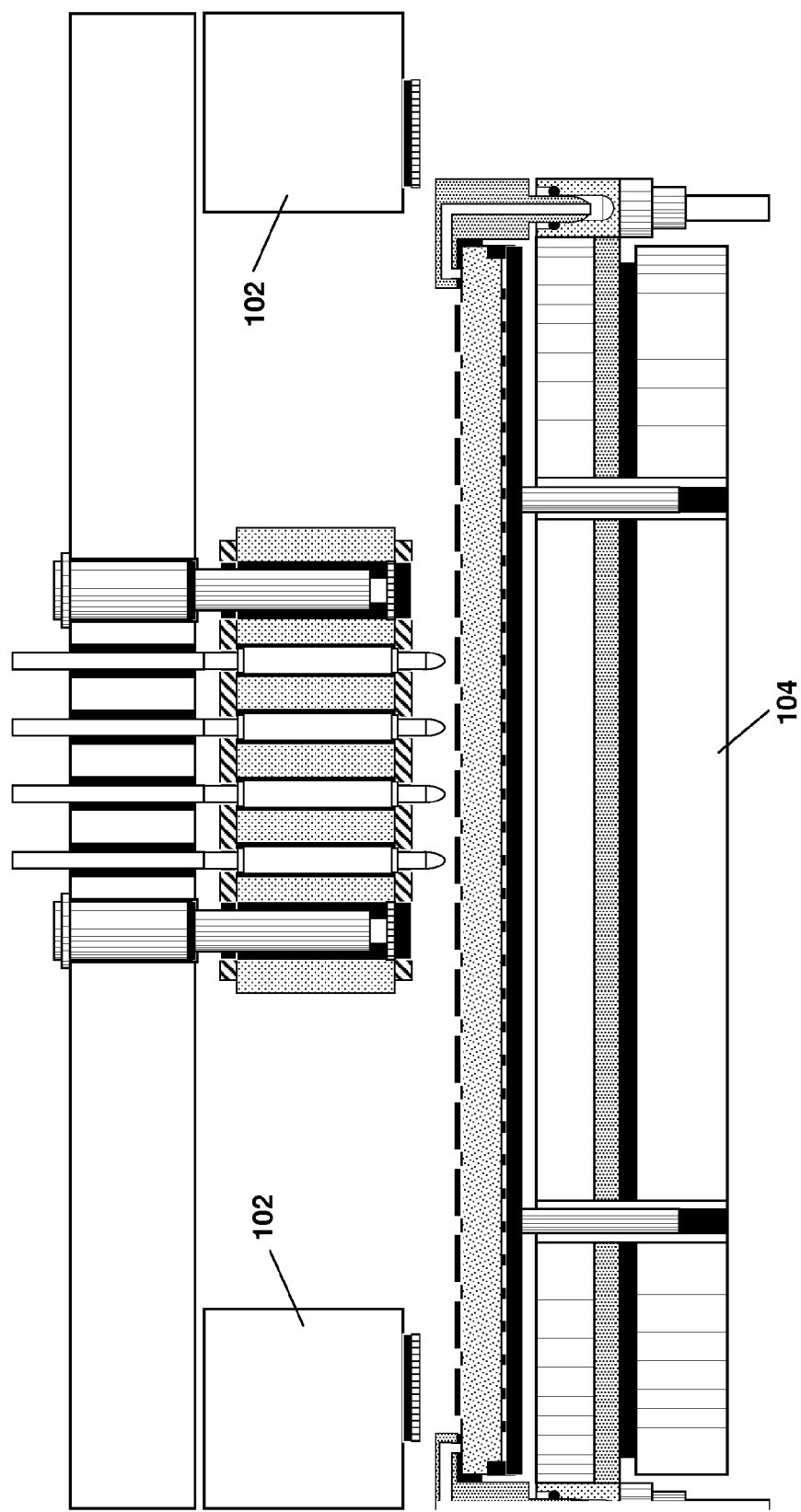
Figure 26:
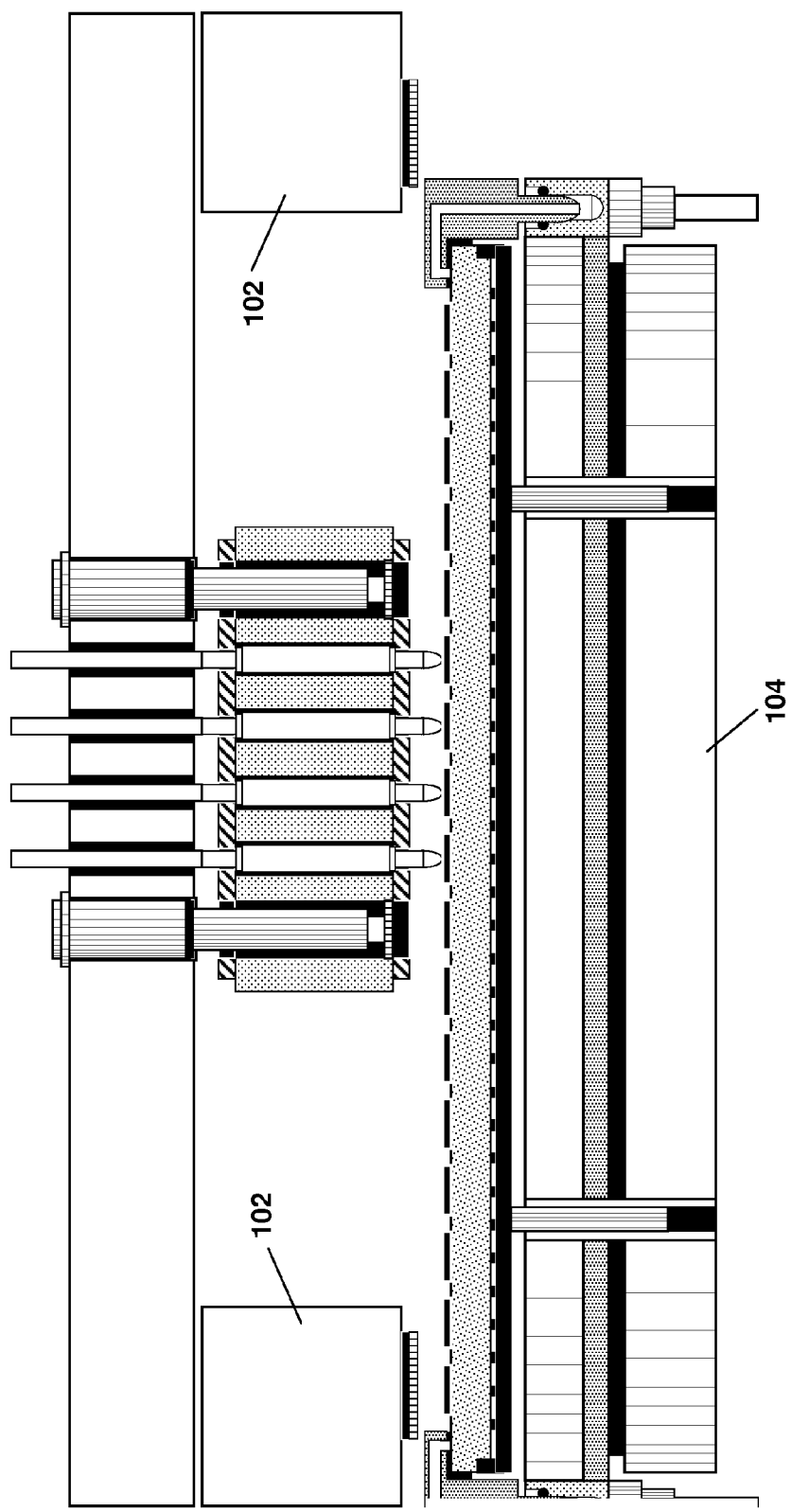
Figure 27:
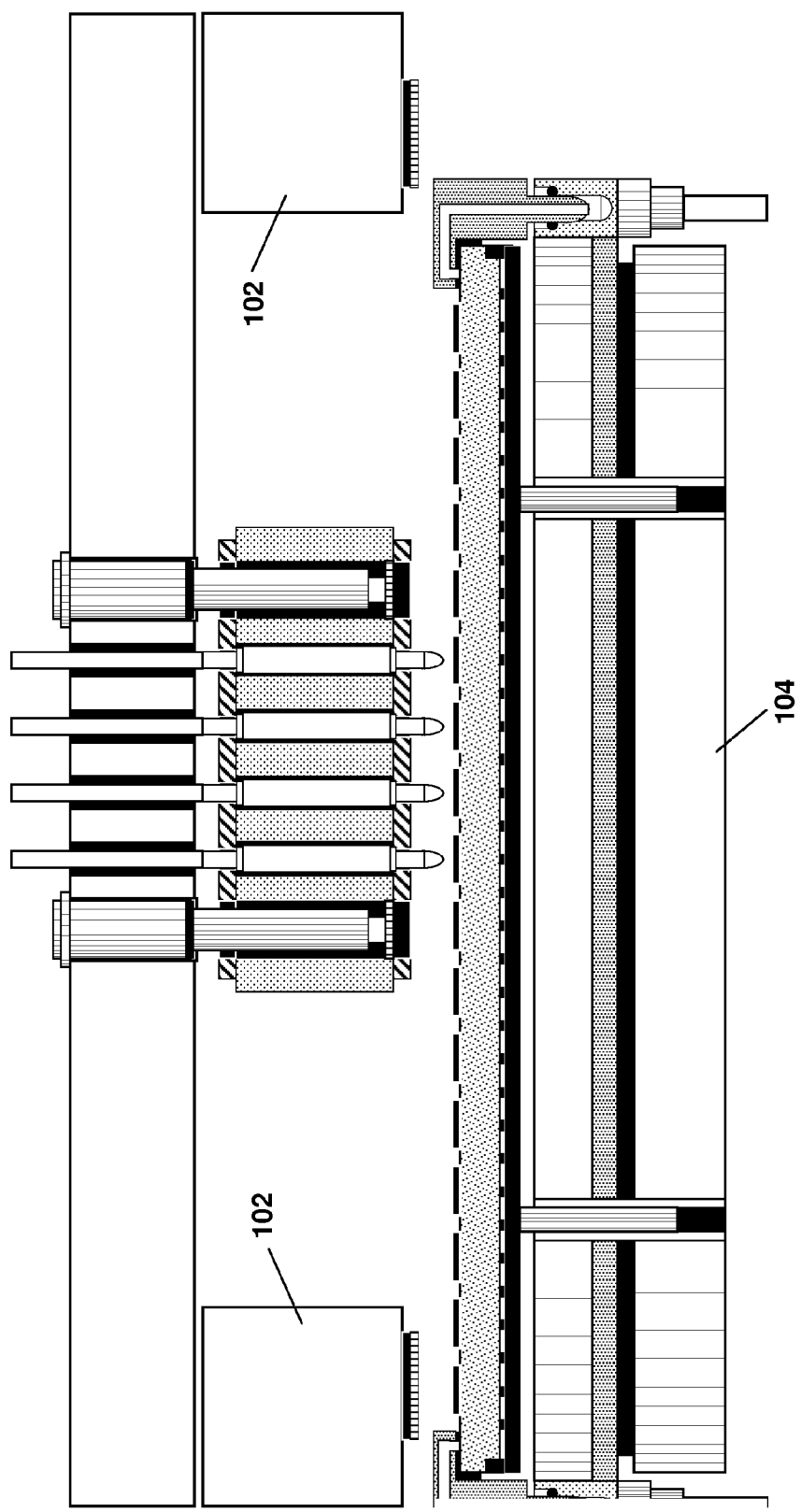
Figure 28:
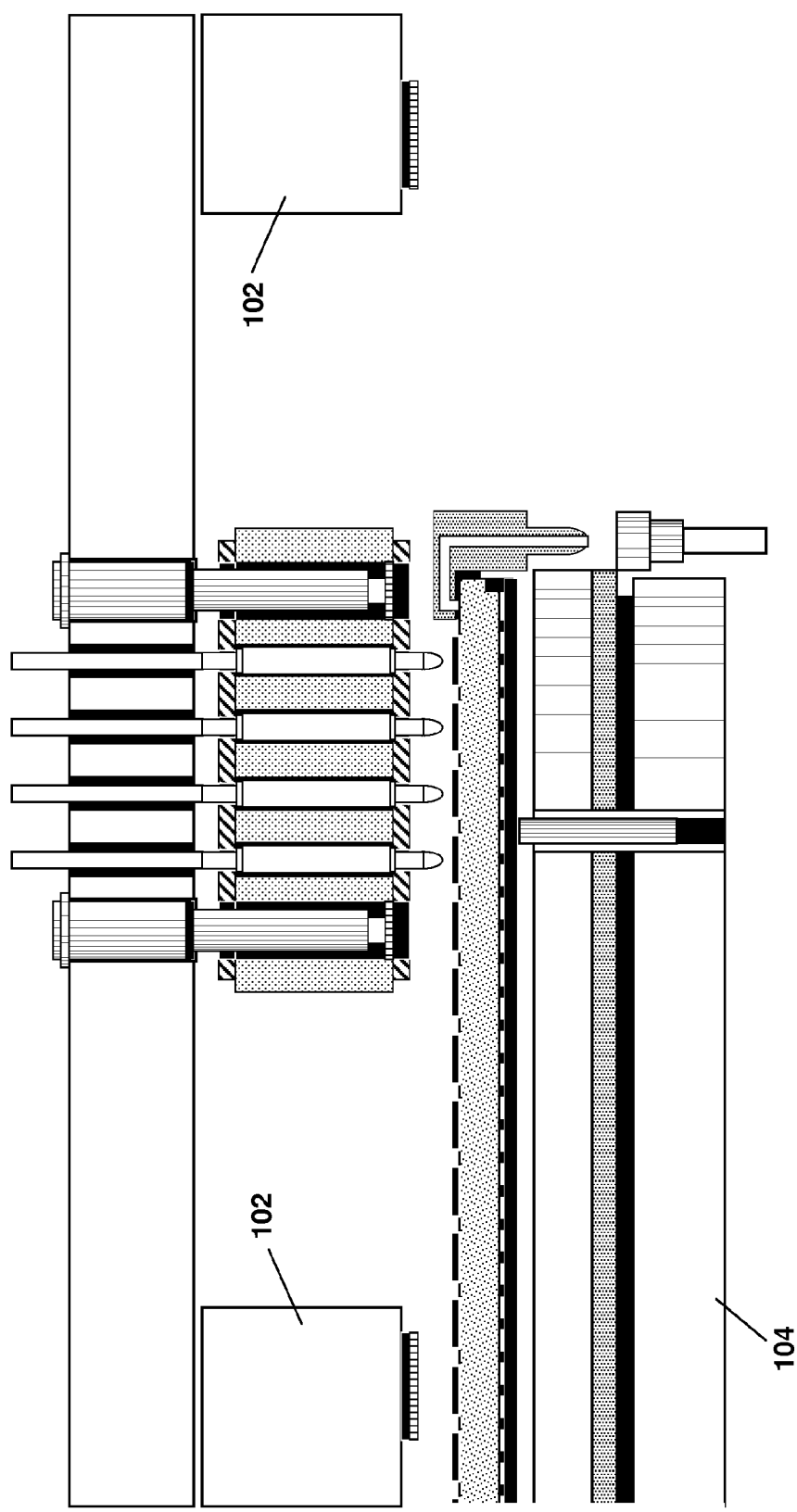
Figure 29:
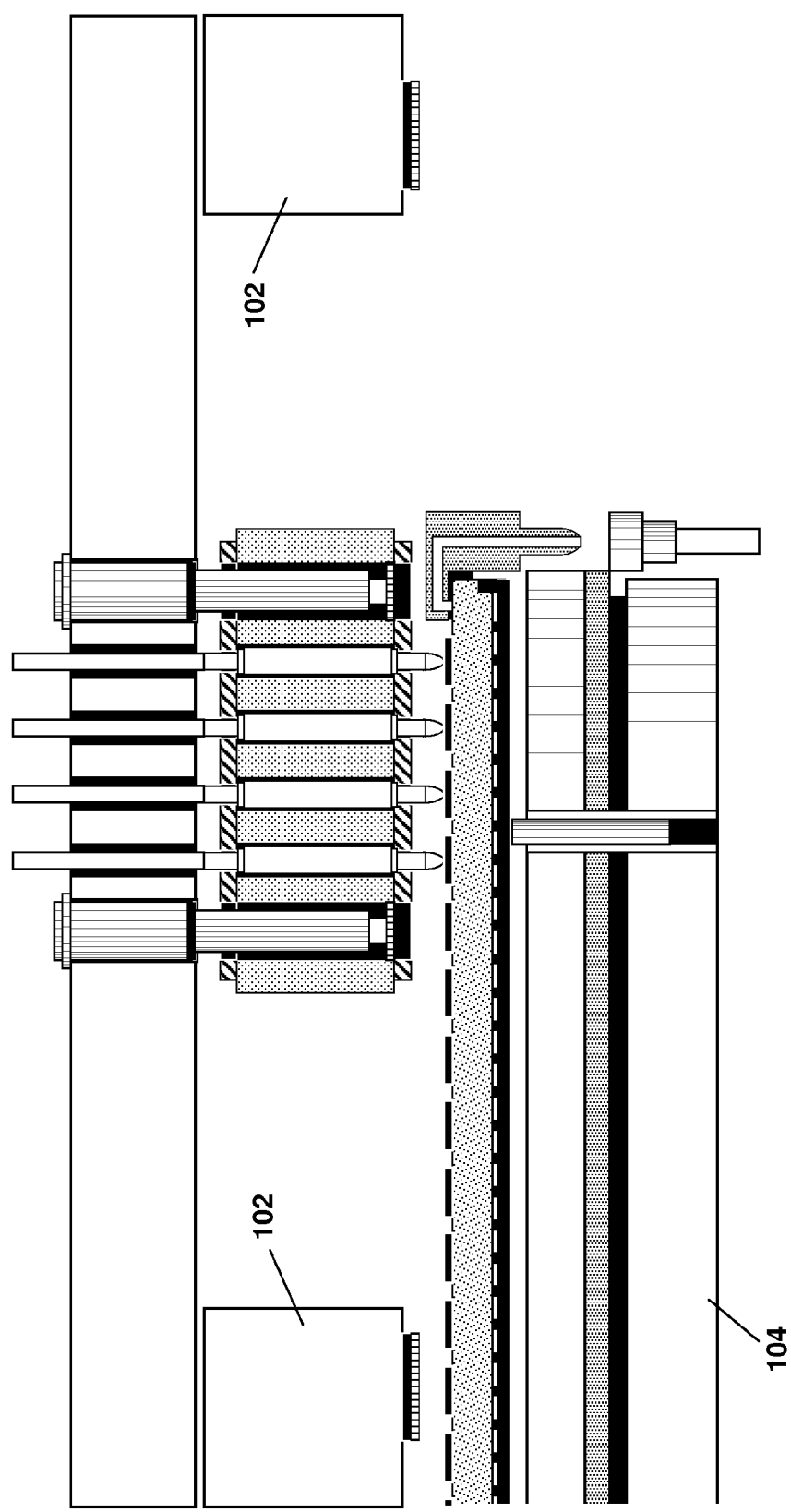
Figure 30:
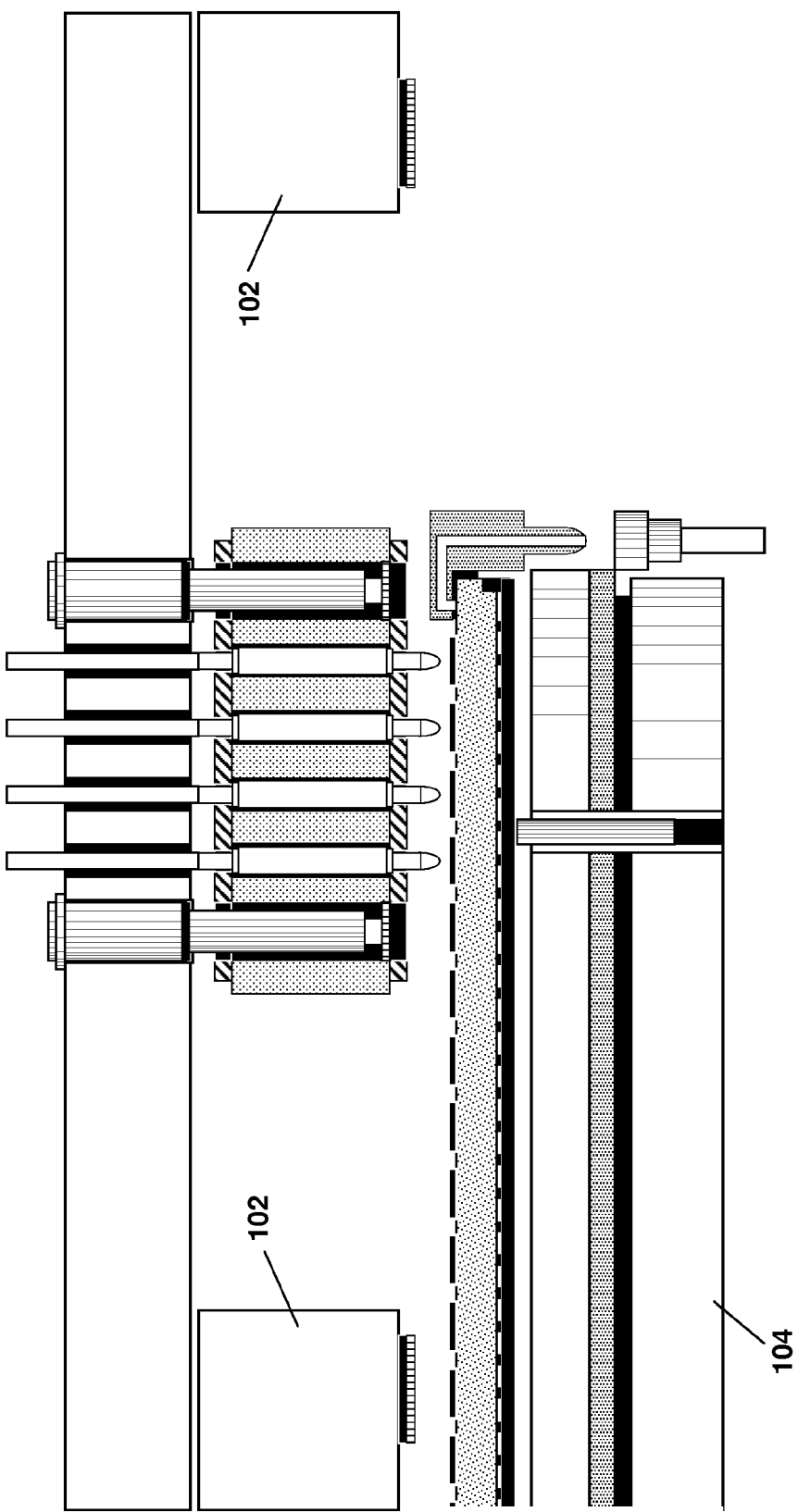
Figure 31:
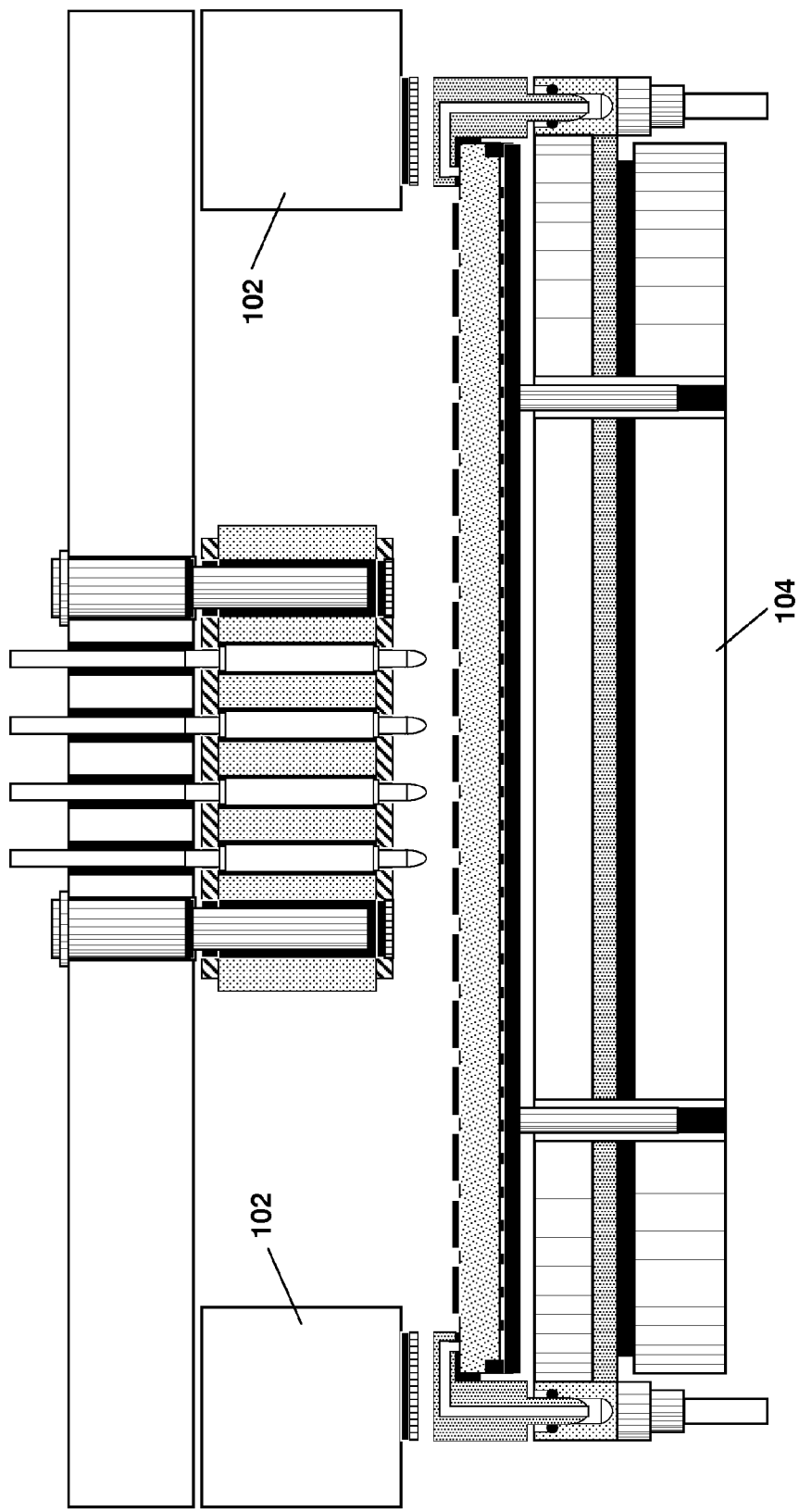
Figure 32:
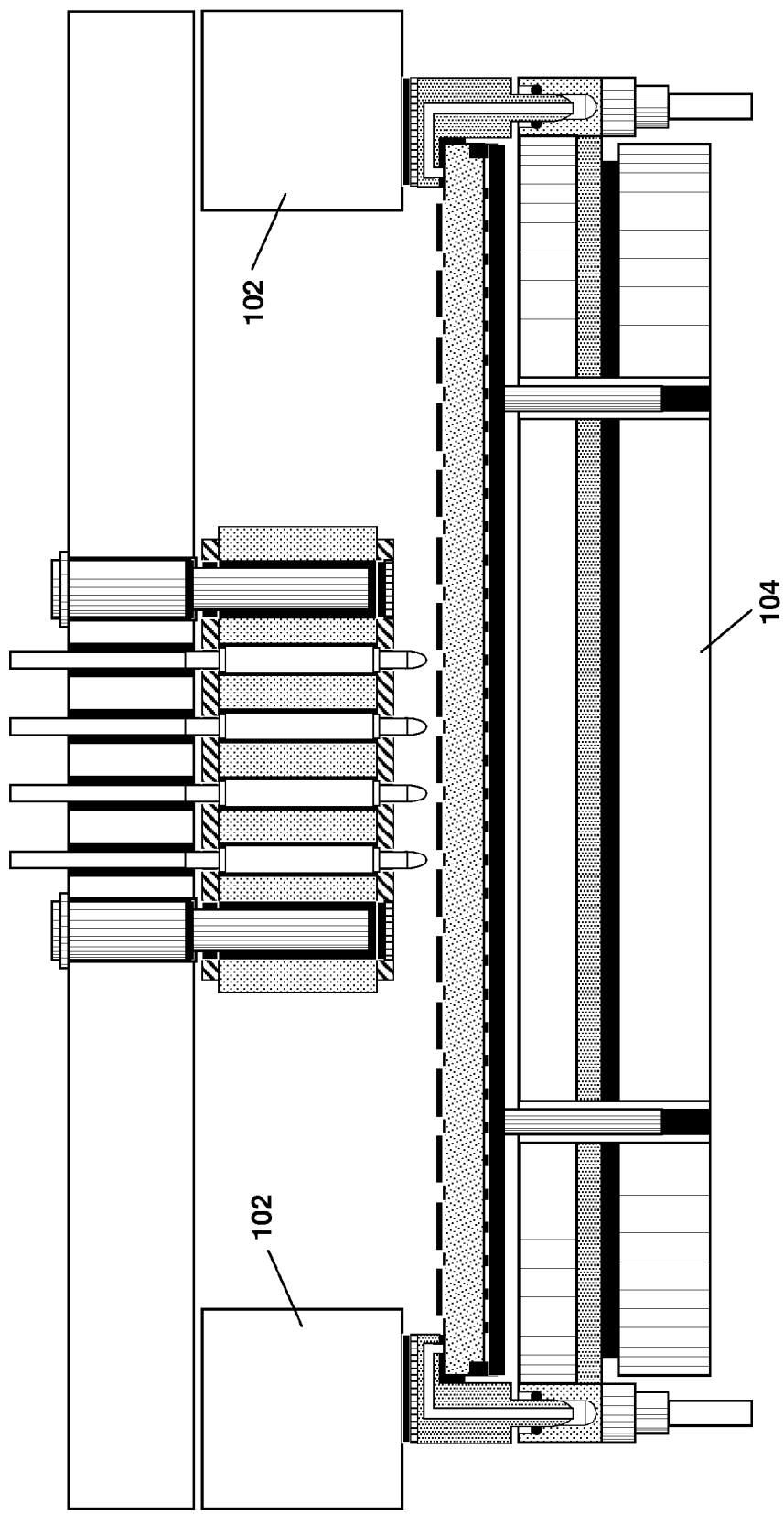
Figure 33:
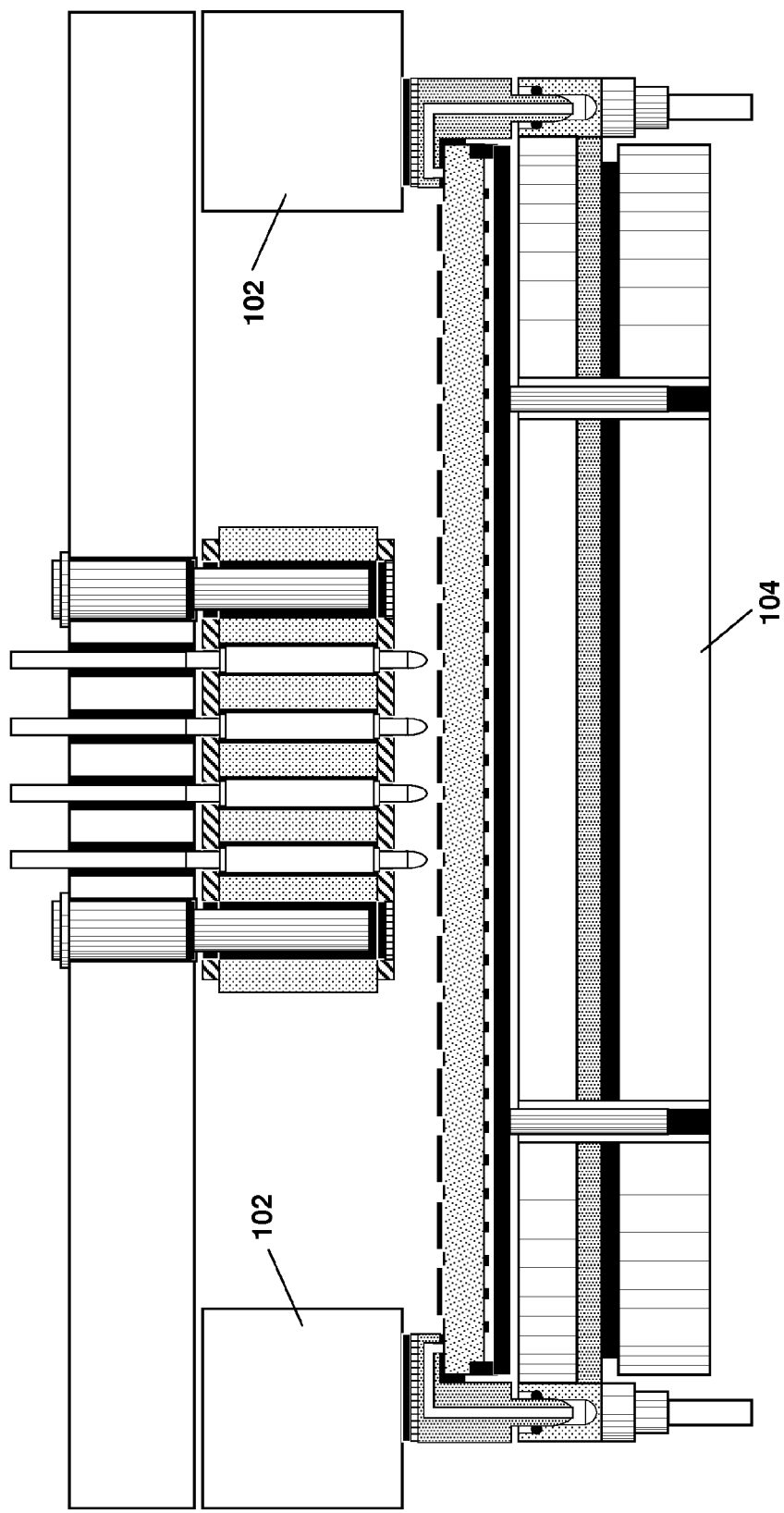
Figure 34:
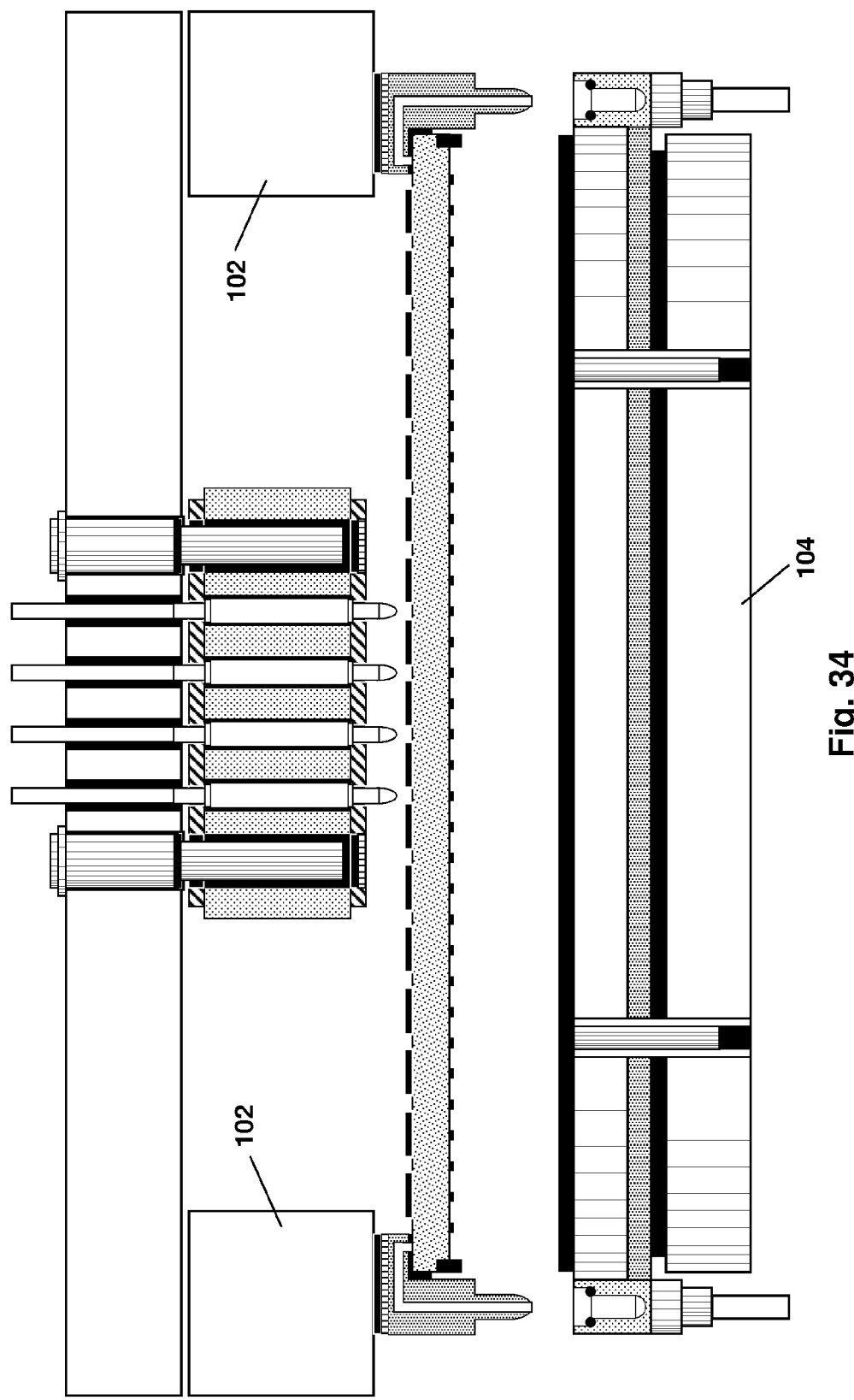
Figure 35:
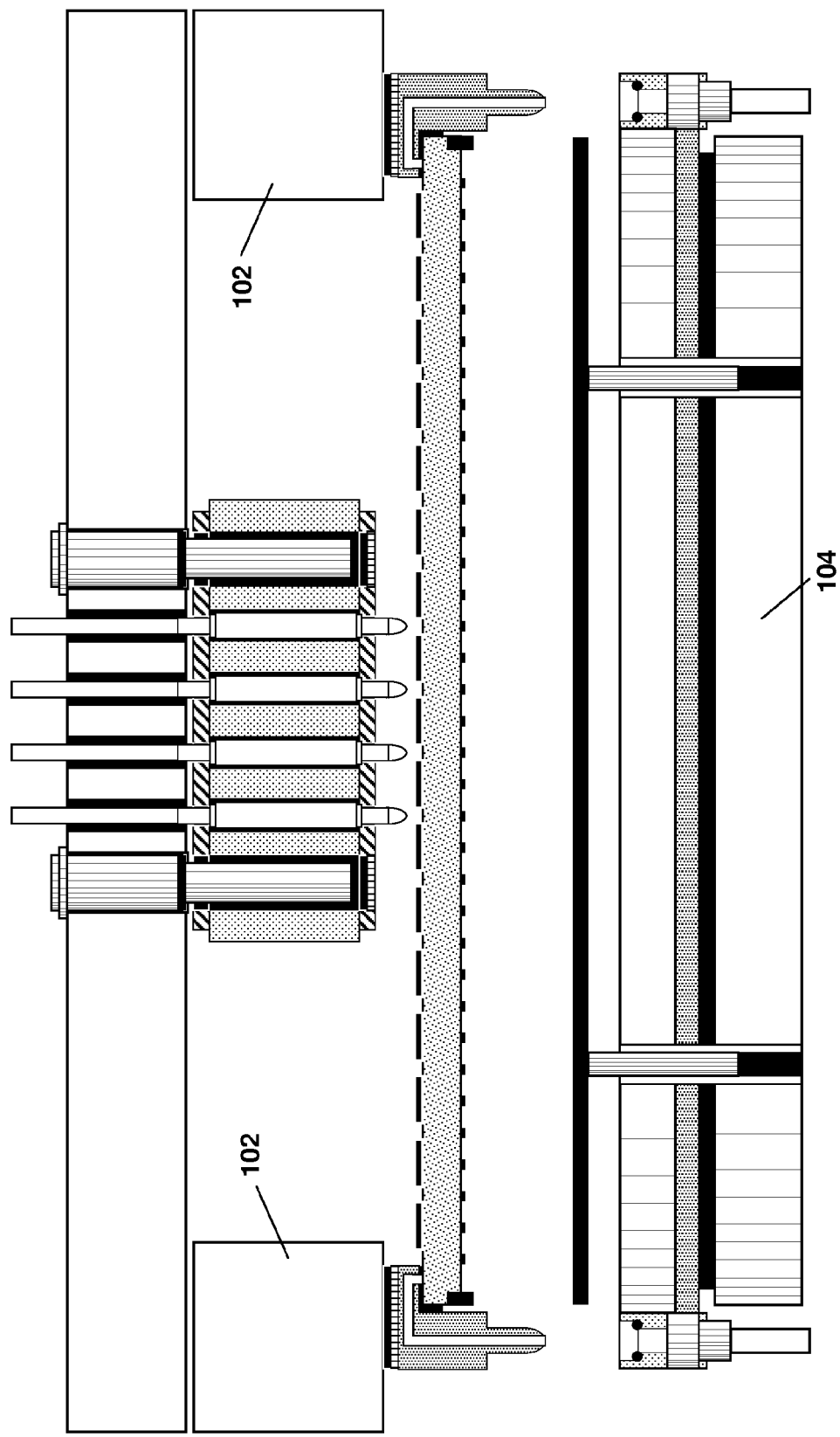

FIG. 6 is a cross-sectional view of a prober-based wafer contact system in accordance with the present invention, and shows probe pins 602. In operation, probe pins 602 come into contact with electrically conductive pads on the inquiry side of wafer translator 702.

Figure 36:
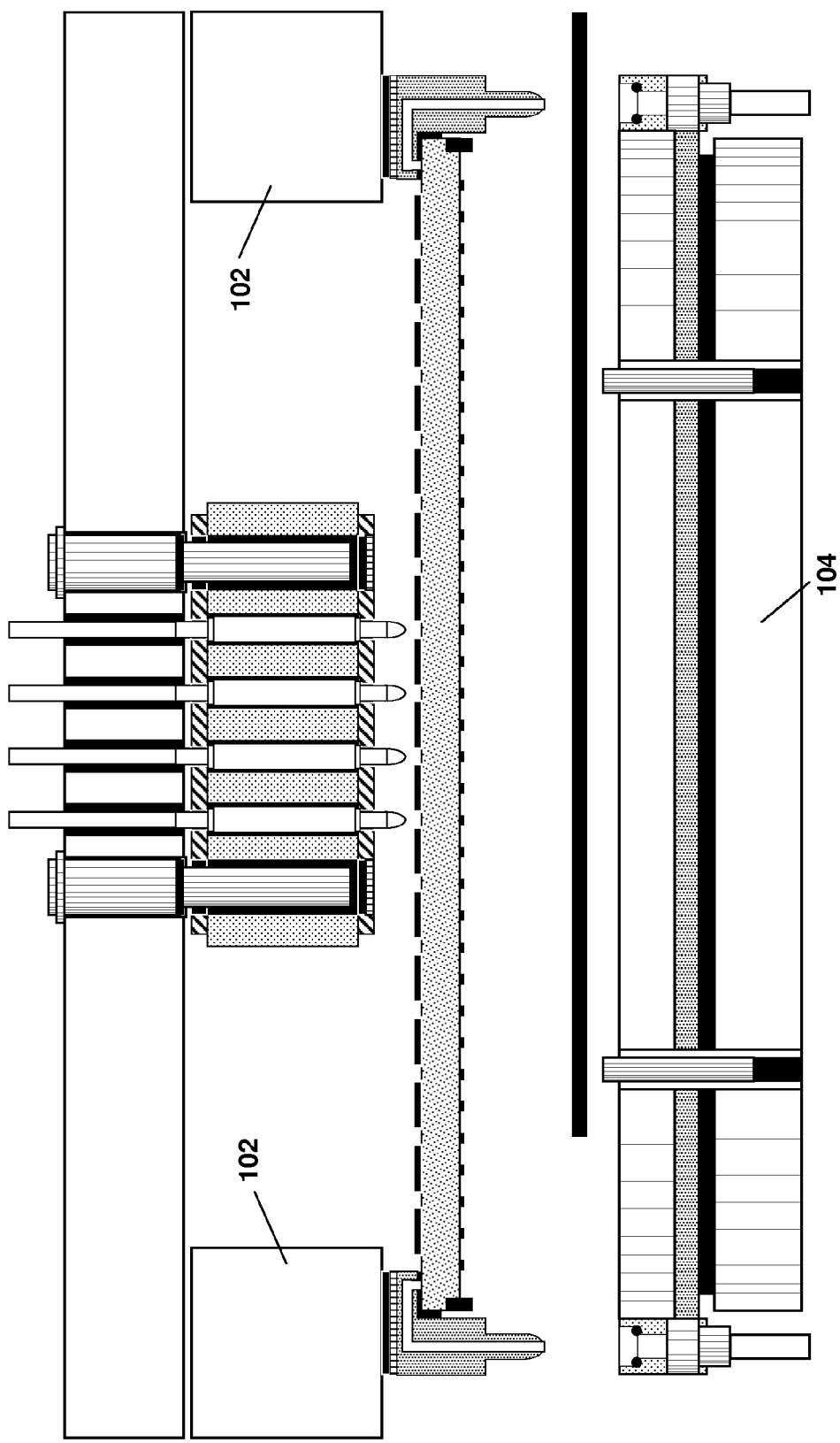

FIG. 36 is a cross-sectional view of a prober-based wafer contact system in accordance with the present invention, and shows the wafer being removed from the prober.

Conclusion

The exemplary methods and apparatus illustrated and described herein find application in at least the field of integrated circuit test and analysis.

What is claimed is:

1. An apparatus for coupling a plurality of electrical pathways to a wafer, comprising:
a wafer translator having a wafer-side positioned to face a wafer and an inquiry-side facing away from the wafer-side, wherein the wafer translator has a first plurality of first scale contact pads at the wafer-side corresponding to contacts on the wafer, and a second plurality of second scale contact pads at the inquiry-side corresponding to contacts of a probe card, wherein the first scale is generally smaller than the second scale, wherein the wafer translator is monolithic between the wafer-side and the inquiry-side, and wherein the wafer translator is mechanically coupled to a mounting fixture;

a gasket positioned to seal a space between the wafer translator and the wafer; and a source of vacuum connected with the space between the wafer translator and the wafer.

2. The apparatus of claim 1, further comprising:

the wafer in contact with the wafer-side of the translator, wherein the wafer translator is more rigid than the wafer.

3. The apparatus of claim 2 wherein the wafer is at least partially conformed to the wafer translator.

4. The apparatus of claim 1 wherein the mounting fixture is removably attached to a top plate attachment.

5. The apparatus of claim 1 wherein the wafer translator is an edge extended wafer translator extending outside of a circumferential edge of the wafer.

6. An apparatus for coupling a plurality of electrical pathways to a wafer, comprising:

a wafer translator having a wafer-side positioned to face a wafer and an inquiry-side facing away from the wafer-side, wherein the wafer translator has a first plurality of first scale contact pads at the wafer-side corresponding to contacts on the wafer, and a second plurality of second scale contact pads at the inquiry-side corresponding to contacts at a probe card, wherein the first scale is generally smaller than the second scale, wherein the wafer translator is monolithic between the wafer-side and the inquiry-side, and wherein the wafer translator is mechanically coupled to a mounting fixture;

a gasket positioned to seal a space between the wafer translator and the wafer; and a mounting fixture positioned to carry the wafer translator.

7. The apparatus of claim 6 further comprising a source of vacuum in fluid communication with the space between the wafer translator and the wafer.

8. The apparatus of claim 6, further comprising the wafer, and wherein the wafer at least partially conforms to the shape of the wafer translator.

9. An apparatus for coupling a plurality of electrical pathways to a wafer, comprising:

a wafer translator having a wafer-side positioned to face a wafer, an inquiry-side facing away from the wafer-side and a circumferential lateral outer surface between the wafer-side with the inquiry-side, wherein the wafer translator has a first plurality of first scale contact pads at the wafer-side corresponding to contacts of the wafer, and a second plurality of second scale contact pads at the inquiry-side corresponding to contacts of a probe card, wherein the first scale is generally smaller than the second scale, wherein the wafer translator is rigid between the wafer-side, the inquiry-side and the entire circumferential lateral outer surface, and wherein the wafer translator is mechanically coupled to a mounting fixture;

a gasket positioned to seal a space between the wafer translator and the wafer; and a source of vacuum in fluidic communication with the space between the wafer translator and the wafer.

10. The apparatus of claim 9 wherein the wafer translator is an edge extended wafer translator extending outside of a circumferential edge of the wafer.

11. The apparatus of claim 9, further comprising:

the wafer in contact with the wafer-side of the translator, wherein the wafer translator is more rigid than the wafer.

12. The apparatus of claim 11 wherein the wafer is at least partially conformed to the wafer translator.

13. The apparatus of claim 1 wherein the wafer translator is laterally continuous between the wafer-side and the inquiry-side.

14. The apparatus of claim 6 wherein the wafer translator is laterally continuous between the wafer-side and the inquiry-side.

* * * * *

UNITED STATES PATENT AND TRADEMARK OFFICE
CERTIFICATE OF CORRECTION

PATENT NO. : 9,052,355 B2  
APPLICATION NO. : 13/068158  
DATED : June 9, 2015  
INVENTOR(S) : Morgan T. Johnson Page 1 of 1

It is certified that error appears in the above-identified patent and that said Letters Patent is hereby corrected as shown below:

On the Title page, in item (57), in column 2, in "Abstract", line 3, delete "contacter" and insert -- contactor --, therefor.

On the Title page, in item (57), in column 2, in "Abstract", line 5, delete "contacter" and insert -- contactor --, therefor.

On the Title page, in item (57), in column 2, in "Abstract", line 7, delete "contacter" and insert -- contactor --, therefor.

On the Title page, in item (57), in column 2, in "Abstract", line 10, delete "contacter" and insert -- contactor --, therefor.

In the Specification

In column 1, line 5, delete "Mar. 12, 2009," and insert -- Mar. 13, 2009, --, therefor.

In column 1, line 6, delete "Contacter,"" and insert -- Contactor," --, therefor.

In column 1, line 9, delete "Contacter,"" and insert -- Contactor," --, therefor.

In column 2, line 1, delete "contacter" and insert -- contactor --, therefor.

In column 2, line 3, delete "contacter" and insert -- contactor --, therefor.

In column 2, line 5, delete "contacter" and insert -- contactor --, therefor.

In column 2, line 8, delete "contacter" and insert -- contactor --, therefor.

In column 2, line 14, delete "contacter" and insert -- contactor --, therefor.

In column 3, line 60, delete "contacter" and insert -- contactor --, therefor.

Signed and Sealed this  
Third Day of May, 2016

Michelle K. Lee  
*Director of the United States Patent and Trademark Office*